(12) United States Patent
Kajiyama

(10) Patent No.: US 9,029,943 B2
(45) Date of Patent: May 12, 2015

(54) SEMICONDUCTOR MEMORY DEVICE AND METHOD OF MANUFACTURING THE SAME

(71) Applicant: Kabushiki Kaisha Toshiba, Minato-ku, Tokyo (JP)

(72) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/781,050

(22) Filed: Feb. 28, 2013

(65) Prior Publication Data

US 2014/0001525 A1    Jan. 2, 2014

(30) Foreign Application Priority Data

Jun. 28, 2012  (JP) .................................. 2012-145249

(51) Int. Cl.

| H01L 21/00 | (2006.01) |
|---|---|
| H01L 29/78 | (2006.01) |
| H01L 29/66 | (2006.01) |
| H01L 43/12 | (2006.01) |
| H01L 27/22 | (2006.01) |
| H01F 10/32 | (2006.01) |

(52) U.S. Cl.
CPC .......... *H01L 29/78* (2013.01); *H01L 29/66477* (2013.01); *H01L 43/12* (2013.01); *H01L 27/228* (2013.01); *H01F 10/3254* (2013.01)

(58) Field of Classification Search
CPC ....... H01L 29/78; H01L 27/228; H01L 43/12; H01L 29/66477; H01F 10/3254
USPC ..................... 257/330, 295; 365/72
See application file for complete search history.

(56) References Cited

U.S. PATENT DOCUMENTS

| 8,492,830 | B2 * | 7/2013 | Kajiyama ..................... 257/330 |
|---|---|---|---|
| 8,542,519 | B2 * | 9/2013 | Asao et al. .................... 365/148 |
| 8,629,494 | B2 * | 1/2014 | Kim et al. ..................... 257/334 |
| 8,861,244 | B2 * | 10/2014 | Carter et al. .................... 365/63 |
| 2004/0195602 | A1 * | 10/2004 | Yoda et al. ..................... 257/295 |
| 2010/0002492 | A1 * | 1/2010 | Kajiyama ..................... 365/148 |
| 2010/0224920 | A1 * | 9/2010 | Lee ................. 257/295 |
| 2011/0012179 | A1 * | 1/2011 | Kajiyama ..................... 257/295 |
| 2011/0215382 | A1 * | 9/2011 | Asao et al. .................... 257/252 |
| 2011/0266600 | A1 * | 11/2011 | Kanaya et al. ................ 257/295 |
| 2012/0139028 | A1 * | 6/2012 | Park et al. ..................... 257/324 |
| 2012/0217559 | A1 * | 8/2012 | Kim et al. ..................... 257/296 |
| 2012/0236620 | A1 * | 9/2012 | Sim ................................. 365/72 |
| 2012/0241826 | A1 * | 9/2012 | Satoh et al. ................... 257/295 |
| 2012/0248527 | A1 * | 10/2012 | Kajiyama ..................... 257/330 |
| 2012/0314469 | A1 * | 12/2012 | Shuto ............................. 365/72 |

(Continued)

FOREIGN PATENT DOCUMENTS

JP    2011-233835 A    11/2011

*Primary Examiner* — Laura Menz
(74) *Attorney, Agent, or Firm* — Holtz, Holtz, Goodman & Chick PC

(57) ABSTRACT

The semiconductor memory device includes a cell transistor having a gate insulating film deposited on an inner surface of a groove formed in an upper surface of the semiconductor substrate, a gate electrode buried in the groove with the gate insulating film formed on the inner surface thereof, and a source region and a drain region formed on an upper surface of the active area of the semiconductor substrate on opposite sides of the gate electrode. The semiconductor memory device includes an MTJ element having a variable resistance that varies with a direction of magnetization that is provided on the source region and electrically connected to the source region at a first end thereof.

12 Claims, 48 Drawing Sheets

(56) References Cited

U.S. PATENT DOCUMENTS

| | | | |
|---|---|---|---|
| 2012/0314494 A1* | 12/2012 | Shuto | 365/171 |
| 2013/0043530 A1* | 2/2013 | Kim et al. | 257/334 |
| 2013/0062674 A1* | 3/2013 | Lee et al. | 257/295 |
| 2013/0170281 A1* | 7/2013 | Song et al. | 365/148 |
| 2014/0001525 A1* | 1/2014 | Kajiyama | 257/295 |
| 2014/0042508 A1* | 2/2014 | Lee | 257/295 |
| 2014/0247648 A1* | 9/2014 | Yoon | 365/148 |
| 2014/0254239 A1* | 9/2014 | Song et al. | 365/148 |
| 2014/0256103 A1* | 9/2014 | Kim | 438/270 |
| 2014/0264672 A1* | 9/2014 | Park et al. | 257/421 |
| 2014/0273287 A1* | 9/2014 | Park et al. | 438/3 |

\* cited by examiner

SEMICONDUCTOR MEMORY DEVICE AND METHOD OF MANUFACTURING THE SAME

CROSS-REFERENCE TO RELATED APPLICATION

This application is based upon and claims the benefit of priority from the prior Japanese Patent Application No. 2012-145249, filed on Jun. 28, 2012, the entire contents of which are incorporated herein by reference.

BACKGROUND

1. Field

Embodiments described herein relate generally to a semiconductor memory device and a method of manufacturing the same.

2. Background Art

A conventional magnetic tunnel junction (MTJ) element is formed on a gate of a cell transistor formed by RIE and is electrically connected to a via between gates. In many cases, the via is formed by depositing tungsten by CVD. In these cases, a seam can occur in the via.

The MTJ element may be formed on the seam in the via, on a slope formed because of the seam, or on a step formed between a gate hard mask and the tungsten via because of burying of a gate step. In such a case, the characteristics of the MTJ element can deteriorate.

DETAILED DESCRIPTION

A semiconductor memory device according to an embodiment includes a semiconductor substrate having an active area isolated by an element isolation area. The semiconductor memory device includes a cell transistor having a gate insulating film deposited on an inner surface of a groove formed in an upper surface of the semiconductor substrate, a gate electrode buried in the groove with the gate insulating film formed on the inner surface thereof, and a source region and a drain region formed on an upper surface of the active area of the semiconductor substrate on opposite sides of the gate electrode. The semiconductor memory device includes an MTJ element having a variable resistance that varies with a direction of magnetization that is provided on the source region and electrically connected to the source region at a first end thereof. The semiconductor memory device includes a source line electrically connected to a second end of the MTJ element. The semiconductor memory device includes a bit line electrically connected to the drain region.

In the following, embodiments will be described with reference to the drawings.

First Embodiment

Figure 1:
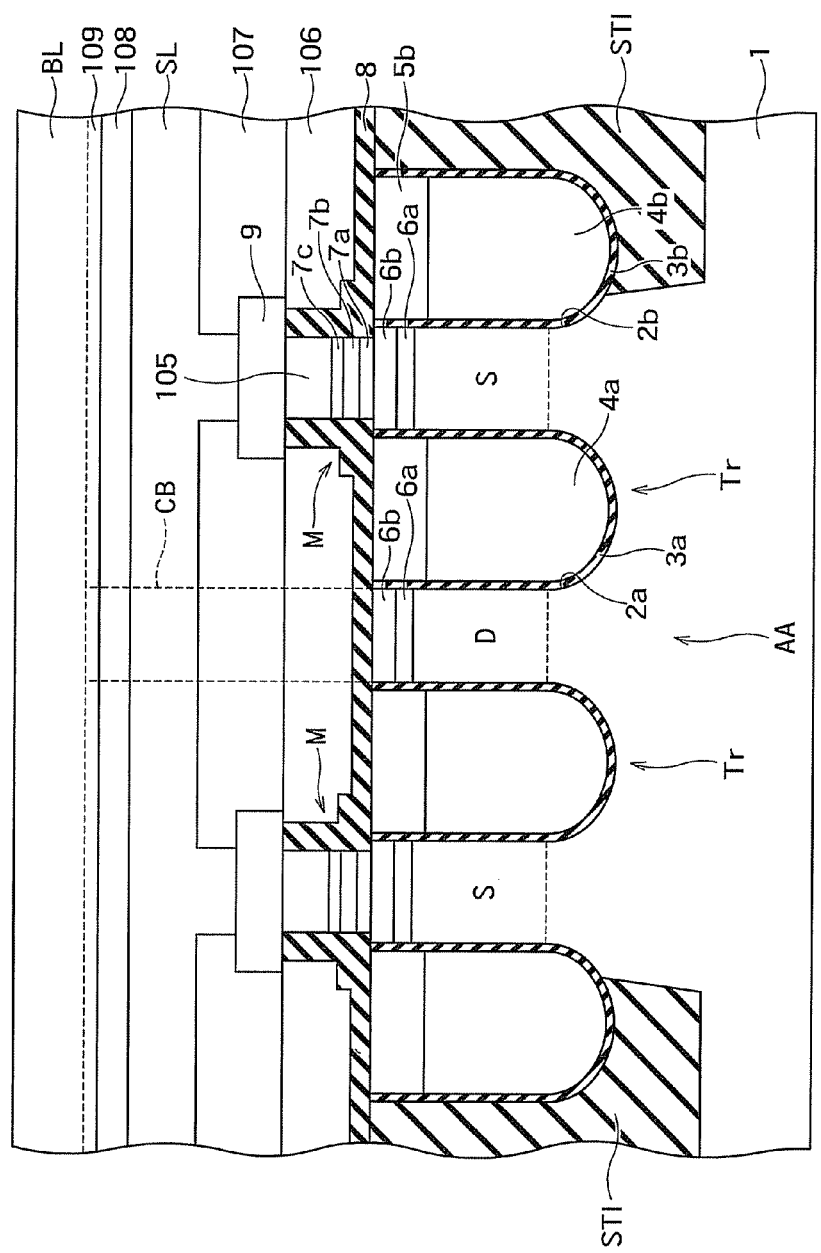
FIG. 1 is a cross-sectional view showing a configuration of a semiconductor memory device 100 according to a first embodiment.

FIG. 1 is a cross-sectional view showing a configuration of a semiconductor memory device 100 according to a first embodiment.

As shown in FIG. 1, the semiconductor memory device (MRAM) 100 includes a semiconductor substrate 1, a cell transistor "Tr" (a recess channel array transistor (RCAT)), a silicide film $5a$, a barrier metal film $5b$, an MTJ element "M", a source line "SL", a bit line "BL" and a bit line contact wire "CB".

The semiconductor substrate 1 has an active area "AA" isolated by an element isolation area "STI". The semiconductor substrate 1 contains silicon, for example.

The cell transistor "Tr" has gate insulating films $3a$ and $3b$ deposited on the inner surfaces of grooves $2a$ and $2b$ formed in the upper surface (upside) of the semiconductor substrate 1, gate electrodes $4a$ and $4b$ buried in the grooves $2a$ and $2b$ with the gate insulating films $3a$ and $3b$ deposited on the inner surfaces thereof, and a source region "S" and a drain region "D" formed on the upper surface of the active area "AA" of the semiconductor substrate 1 on the opposite sides of the gate electrode $4a$.

The drain region "D" is shared by two transistors "Tr" in the example shown in FIG. 1.

The silicide film $6a$ is formed on the source region "S" and the drain region "D".

The barrier metal film $6b$ is formed on the silicide film $6a$. The upper surface of the barrier metal film $6b$ is planarized by chemical mechanical polishing (CMP) or the like and thus is substantially flat.

The barrier metal film 6b serves as a lower electrode. The barrier metal film 6b is made of titanium, tantalum, tungsten, copper or a nitride film thereof, for example.

The MTJ element "M" is formed over the source region "S" and is electrically connected to the source region "S" at one end thereof. In the example shown in FIG. 1, the MTJ element "M" is electrically connected to the source region "S" at one end thereof via the silicide film 6a and the barrier metal film 6b.

The MTJ element "M" has a variable resistance, which varies with the direction of magnetization.

The MTJ element "M" has a first ferromagnetic layer 7a, a barrier layer 7b and a second ferromagnetic layer 7c.

The first ferromagnetic layer 7a is formed over the source region "S" and is electrically connected to the source region "S".

The barrier layer 7b is formed on the first ferromagnetic layer 7a.

The second ferromagnetic layer 7c is formed on the barrier layer 7b and is electrically connected to the source line "SL".

Of the first ferromagnetic layer 7a and the second ferromagnetic layer 7c, one whose direction of magnetization is fixed constitutes a pinned layer, and the other, whose direction of magnetization is inverted by an external magnetic field or a spin transfer torque, constitutes a free layer.

In other words, one of the first and second ferromagnetic layers 7a and 7c constitutes a pinned layer, and the other constitutes a free layer. Although this embodiment has been described on the assumption that the MTJ element "M" has a three-layer structure, the MTJ element "M" is not limited to the three-layer structure and can be modified in various ways without departing from the spirit of the present invention.

The free layer is made of a metal, such as cobalt, iron, nickel, boron, platinum, palladium, terbium, tantalum, tungsten, iridium and ruthenium, or an alloy or laminate film thereof, for example.

The barrier layer is made of a film of a metal oxide, such as alumina and magnesium oxide, for example.

The source line "SL" is electrically connected to the other end of the MTJ element "M" via a conductive hard mask 105 and an upper electrode 9.

The bit line contact wire "CB" is formed over the drain region "D" with the silicide film 6a and the barrier metal film 6b interposed therebetween. The bit line contact wire "CB" is connected an extension of the drain region "D" in a first direction D1 (a direction perpendicular to the sheet of the cross-sectional view of the FIG. 1) described later. This is why the bit line contact wire "CB" is shown by a dotted line.

The bit line "BL" is electrically connected to the drain region "D". In the example shown in FIG. 1, the bit line "BL" is electrically connected to the drain region "D" via the silicide film 6a, the barrier metal film 6b and the bit line contact wire "CB". The bit line "BL" is disposed at a position shifted in the first direction D1 described later and therefore is shown by a dotted line.

In the example shown in FIG. 1, the bit line "BL" is positioned in a layer higher than the MTJ element "M" and the source line "SL".

As required, multilayer wiring (not shown) may be provided above the bit line "BL", for example.

Next, an example of a method of manufacturing the semiconductor memory device 100 configured as described above will be described.

FIGS. 2 to 26 are cross-sectional views for illustrating examples of steps of the method of manufacturing the semiconductor memory device 100 shown in FIG. 1. FIGS. 27 to 32 are plane views for illustrating examples of steps of the method of manufacturing the semiconductor memory device 100 shown in FIG. 1. The cross-sectional views of FIGS. 2 to 26 showing steps of the method are taken along the line X-X' in FIG. 27.

Figure 2:
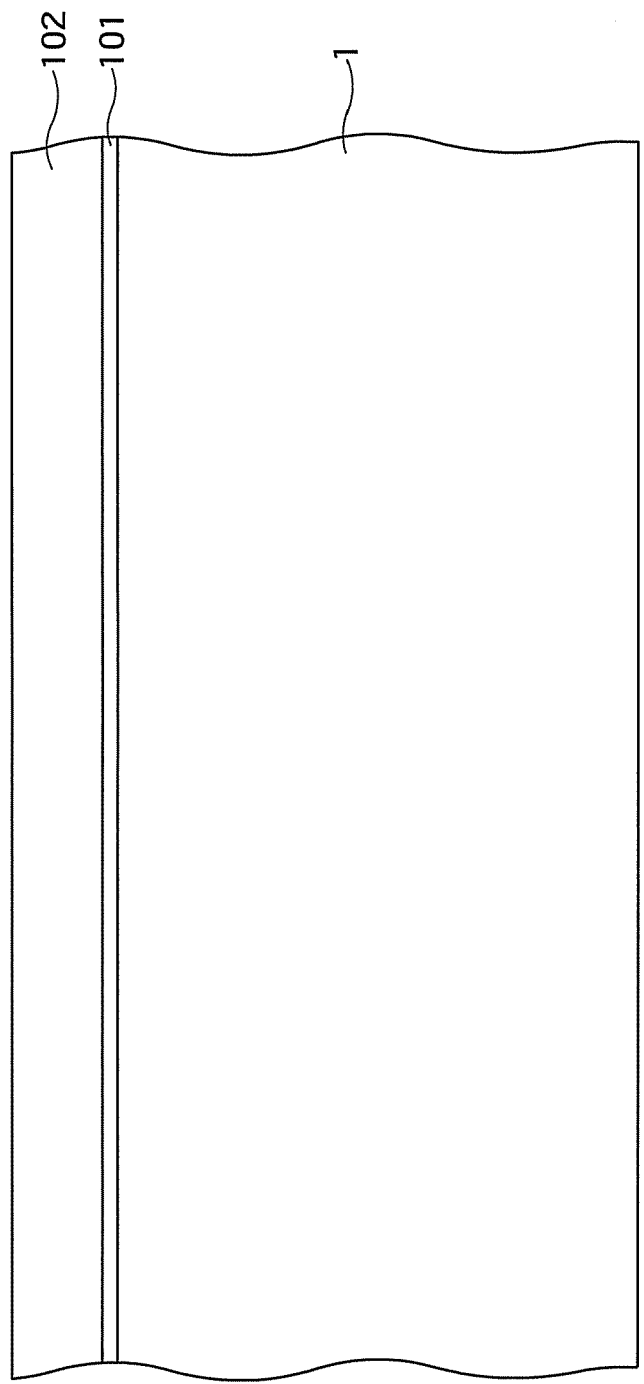
FIG. 2 is a cross-sectional view for illustrating the example of step of the method of manufacturing the semiconductor memory device 100 shown in FIG. 1.

First, as shown in FIG. 2, an oxide film 101 is formed on the semiconductor substrate 1 by thermal oxidation, for example, and a SiN film 102 is deposited on the oxide film 101 by chemical vapor deposition (CVD). In this way, a mask material used in formation of the element isolation area "STI" is formed on the semiconductor substrate 1.

Figure 3:
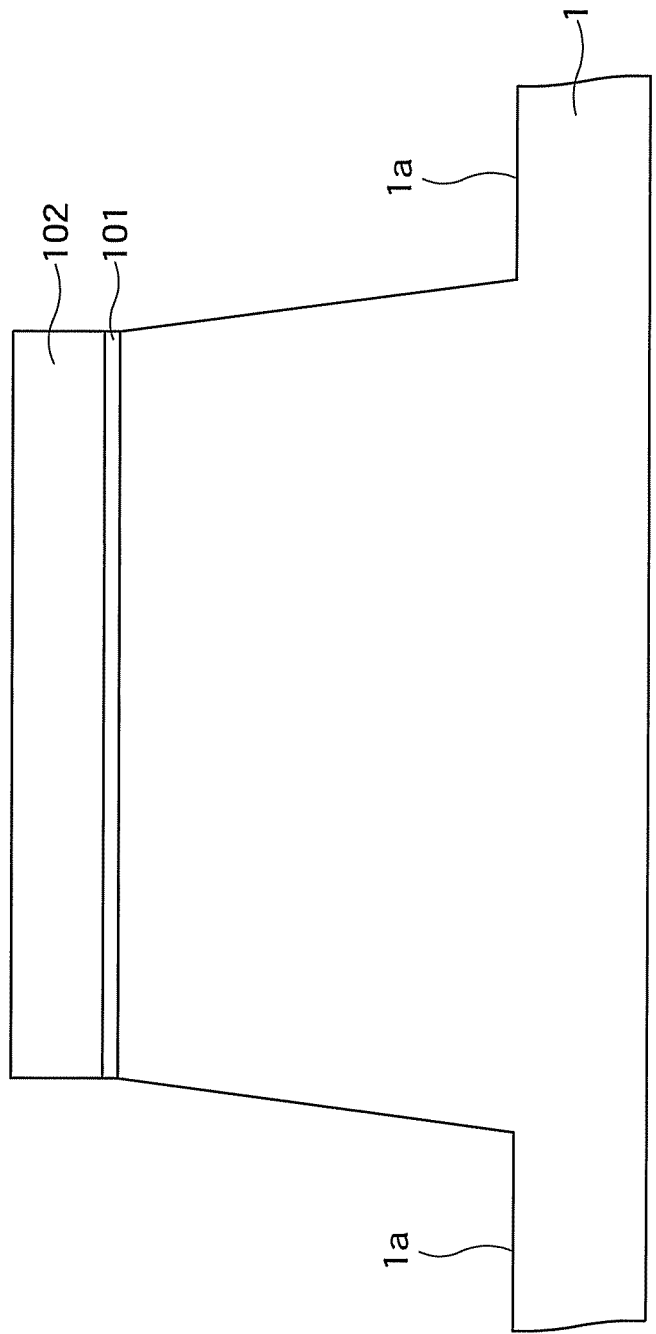
FIG. 3 is a cross-sectional view for illustrating the example of step of the method of manufacturing the semiconductor memory device 100 shown in FIG. 1, is continuous from FIG. 2.

Then, as shown in FIG. 3, the SiN film 102 and the oxide film 101, which constitute the mask material, and the semiconductor substrate 1 are etched by lithography and reactive ion etching (RIE), for example, to form an STI groove 1a.

Figure 4:
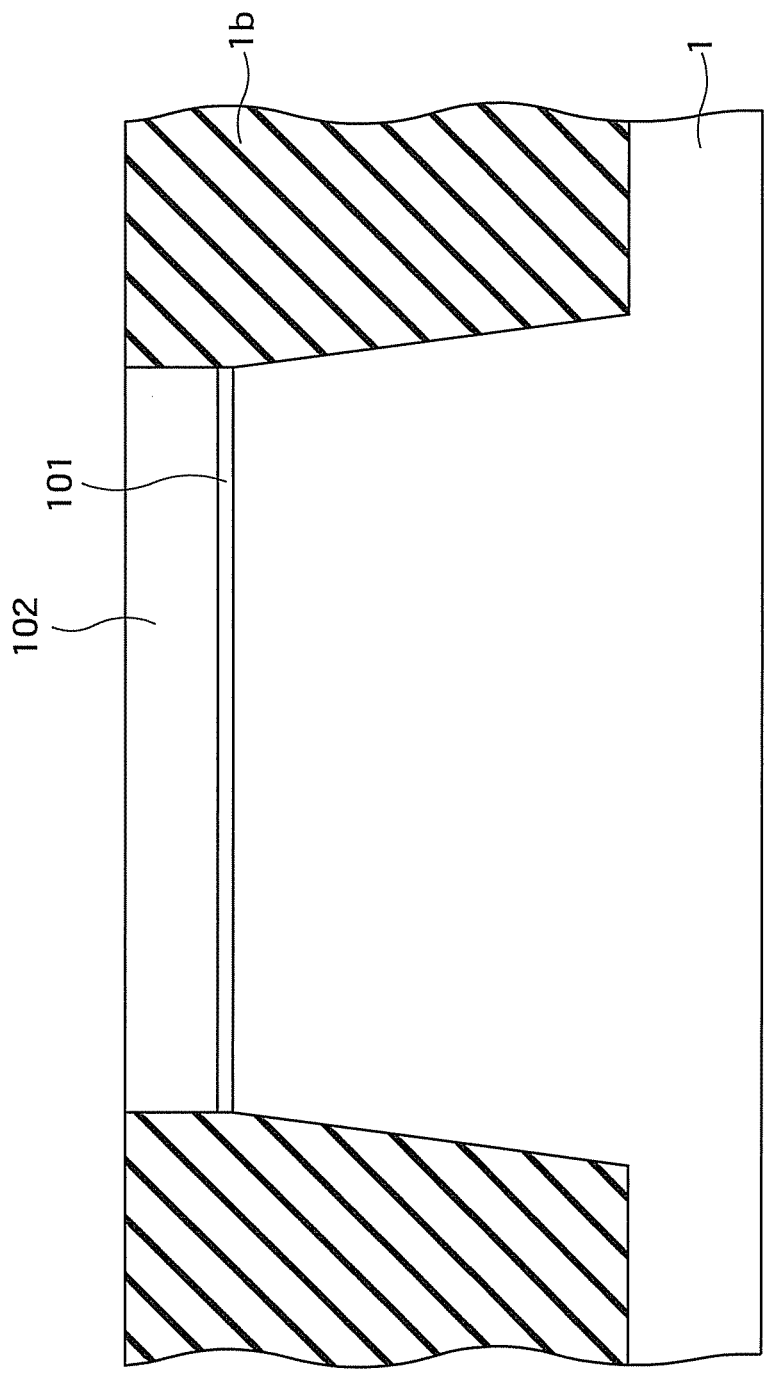
FIG. 4 is a cross-sectional view for illustrating the example of step of the method of manufacturing the semiconductor memory device 100 shown in FIG. 1, is continuous from FIG. 3.

Then, as shown in FIG. 4, an oxide film is buried in the STI groove 1a by polysilazane application and a thermal processing or high density plasma chemical vapor deposition (HD-PCVD), for example. Then, the surface of the semiconductor substrate 1 is planarized by CMP.

Figure 5:
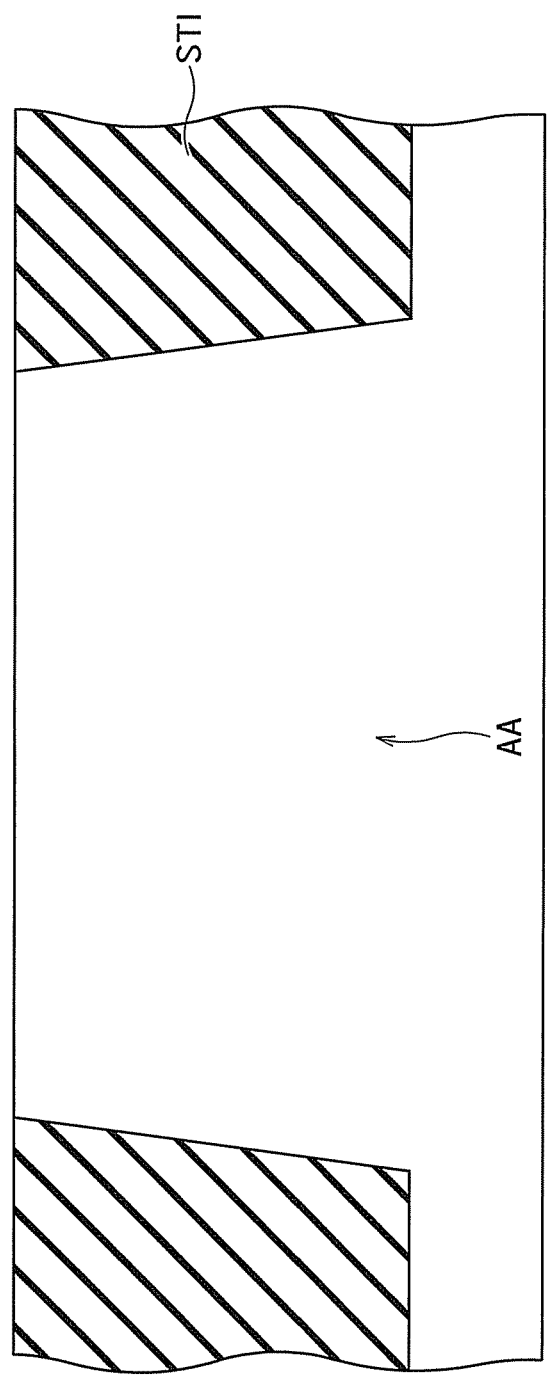
FIG. 5 is a cross-sectional view for illustrating the example of step of the method of manufacturing the semiconductor memory device 100 shown in FIG. 1, is continuous from FIG. 4.

Then, as shown in FIG. 5, the SiN film 102 serving as the mask material and the oxide film 101 are etched by a we processing using hot phosphoric acid, DHF or the like so that the upper surface of the semiconductor substrate 1 and the upper surface of the element isolation area "STI" are flush with each other. Then, the active area "AA" is formed in the semiconductor substrate 1 by ion implantation.

Figure 27:
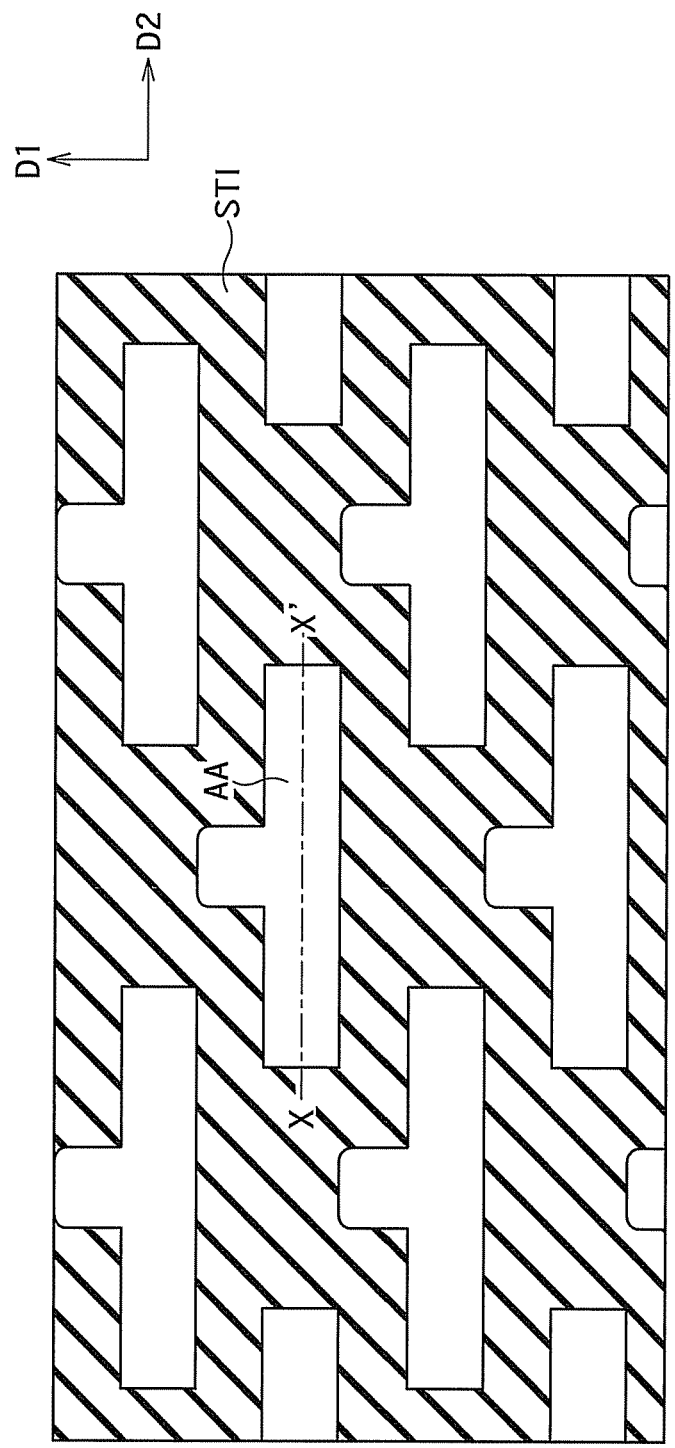
FIG. 27 is a plane view for illustrating the example of step of the method of manufacturing the semiconductor memory device 100 shown in FIG. 1.

In this way, the active area "AA" isolated by the element isolation area "STI" is formed in the semiconductor substrate 1 (FIG. 27). A part of the active area "AA" that is to constitute a drain region extends in the first direction D1. A channel direction of the active area "AA" is a second direction D2.

Figure 6:
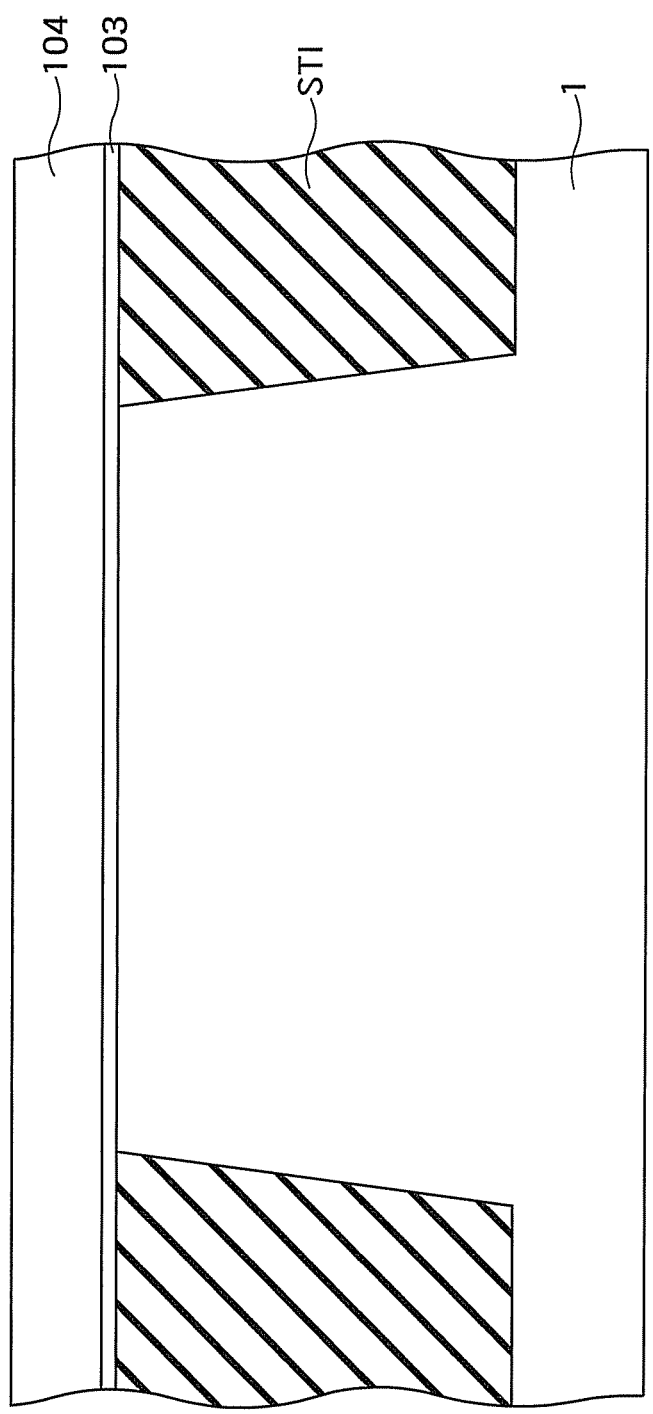
FIG. 6 is a cross-sectional view for illustrating the example of step of the method of manufacturing the semiconductor memory device 100 shown in FIG. 1, is continuous from FIG. 5.

Then, as shown in FIG. 6, an oxide film 103 is formed on the semiconductor substrate 1 by thermal oxidation, for example, and a SiN film 104 is deposited on the oxide film 103 by CVD. In this way, a hard mask used in formation of a groove for a buried gate is formed.

Figure 7:
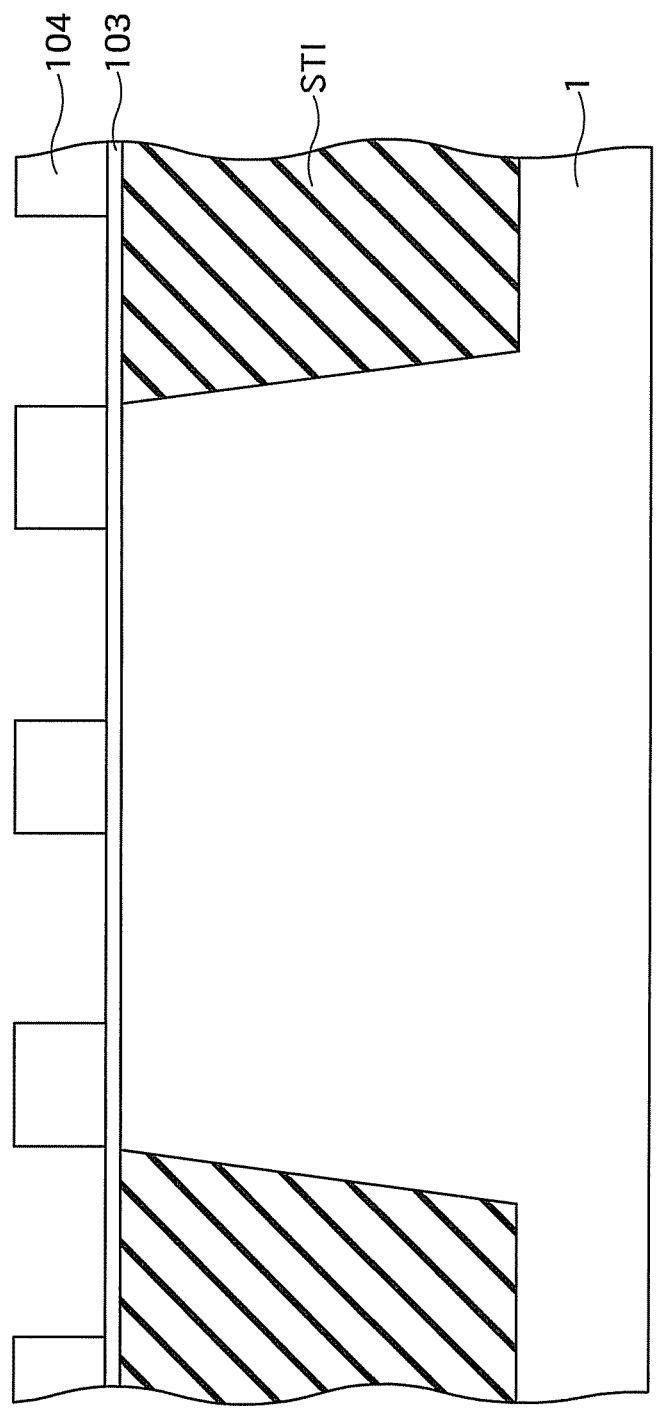
FIG. 7 is a cross-sectional view for illustrating the example of step of the method of manufacturing the semiconductor memory device 100 shown in FIG. 1, is continuous from FIG. 6.

Then, as shown in FIG. 7, the SiN film 104 serving as the hard mask is etched by lithography and RIE, for example.

Figure 8:
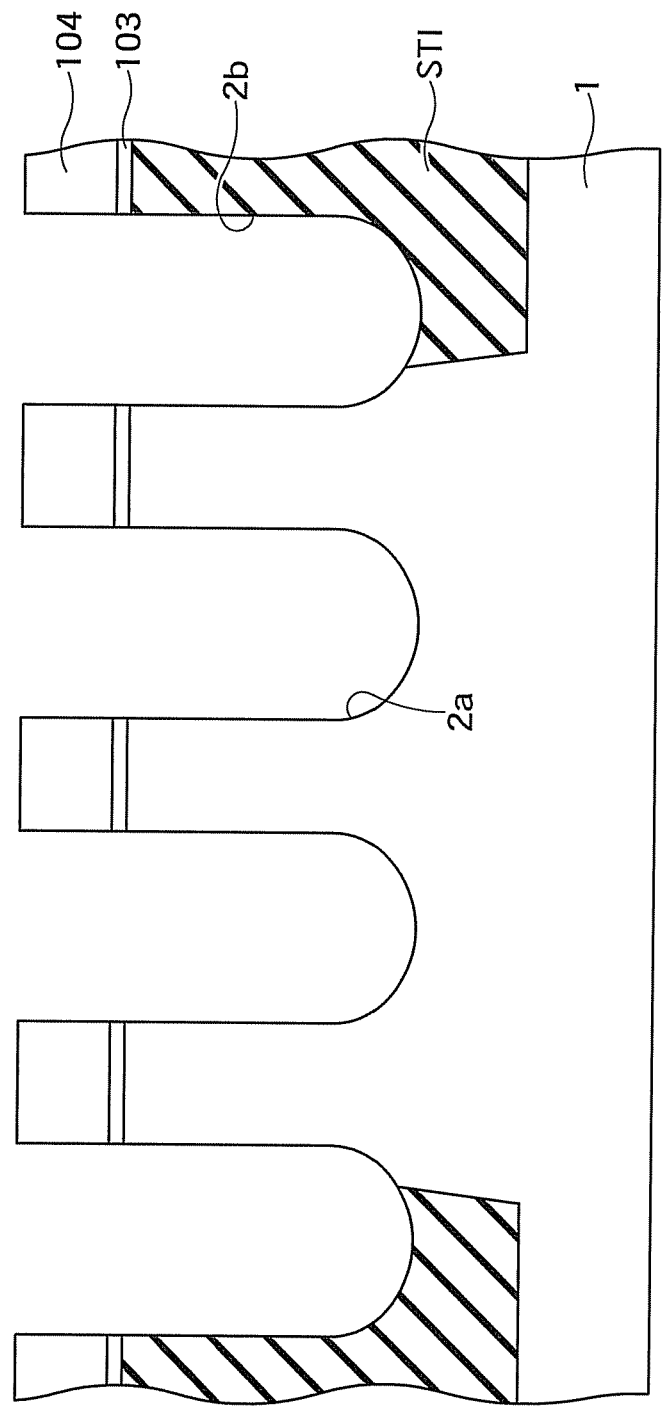
FIG. 8 is a cross-sectional view for illustrating the example of step of the method of manufacturing the semiconductor memory device 100 shown in FIG. 1, is continuous from FIG. 7.

Then, as shown in FIG. 8, using the SiN film 104 remaining after peeling off of the resist, the element isolation area "STI" and the semiconductor substrate 1 are etched at the same time.

In this way, the grooves 2a and 2b extending in the first direction D1 are formed in the upper surface of the semiconductor substrate 1.

Figure 9:
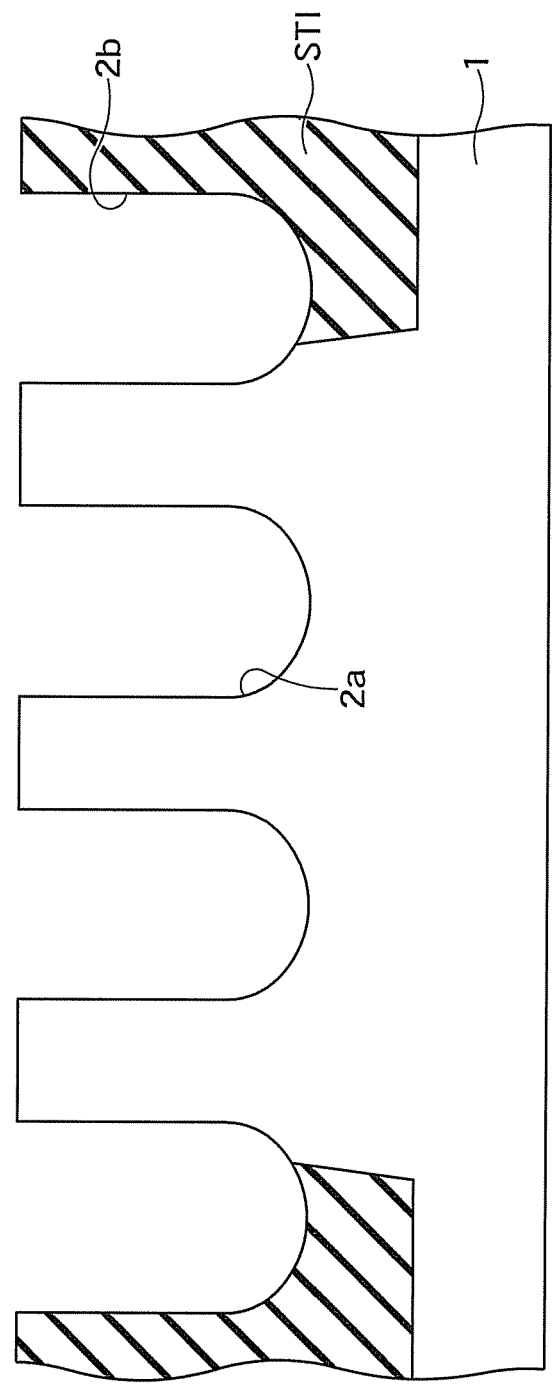
FIG. 9 is a cross-sectional view for illustrating the example of step of the method of manufacturing the semiconductor memory device 100 shown in FIG. 1, is continuous from FIG. 8.

Then, as shown in FIG. 9, the SiN film 104 serving as the mask material and the oxide film 103 on the semiconductor substrate 1 removed by a we processing using hot phosphoric acid and DHF, for example.

Figure 10:
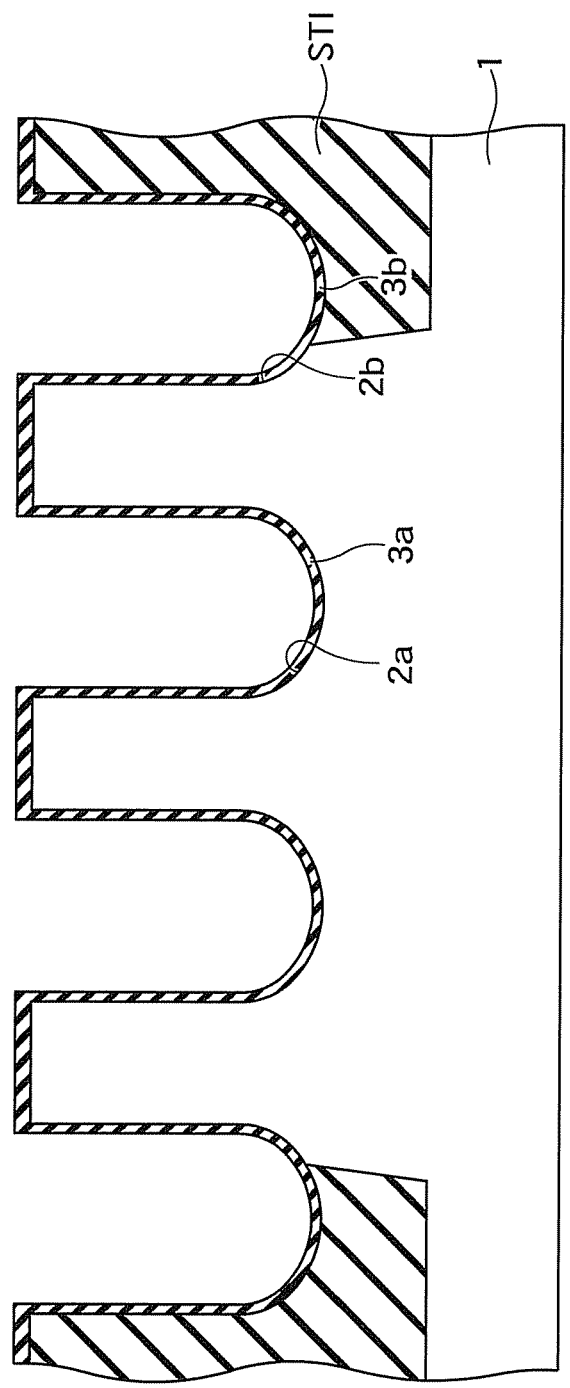
FIG. 10 is a cross-sectional view for illustrating the example of step of the method of manufacturing the semiconductor memory device 100 shown in FIG. 1, is continuous from FIG. 9.

Then, as shown in FIG. 10, the gate oxide films 3a and 3b are formed on the inner surfaces of the grooves 2a and 2b by thermal oxidation, for example. At the same time, a gate oxide film for a peripheral circuit part (not shown) is also formed. In this process, a multi-oxide may be formed by repeating the lithography, the we processing using DHF, and the thermal oxidation, or an oxynitride may be used for the gate oxide film.

Figure 11:
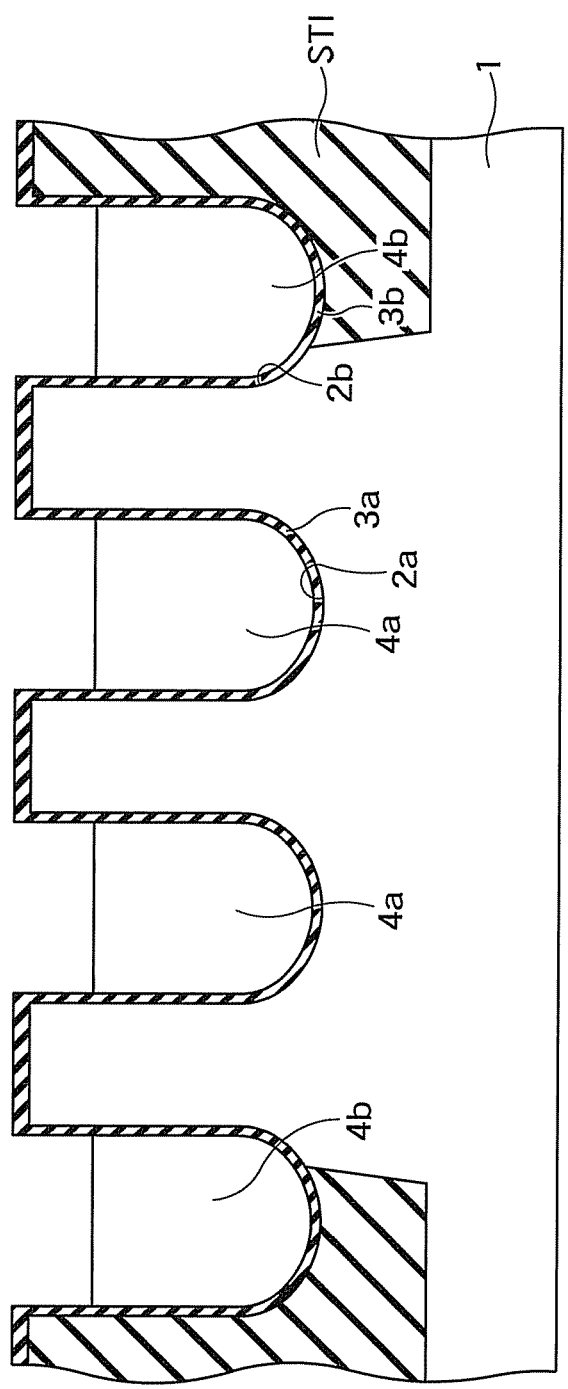
FIG. 11 is a cross-sectional view for illustrating the example of step of the method of manufacturing the semiconductor memory device 100 shown in FIG. 1, is continuous from FIG. 10.
Figure 28:
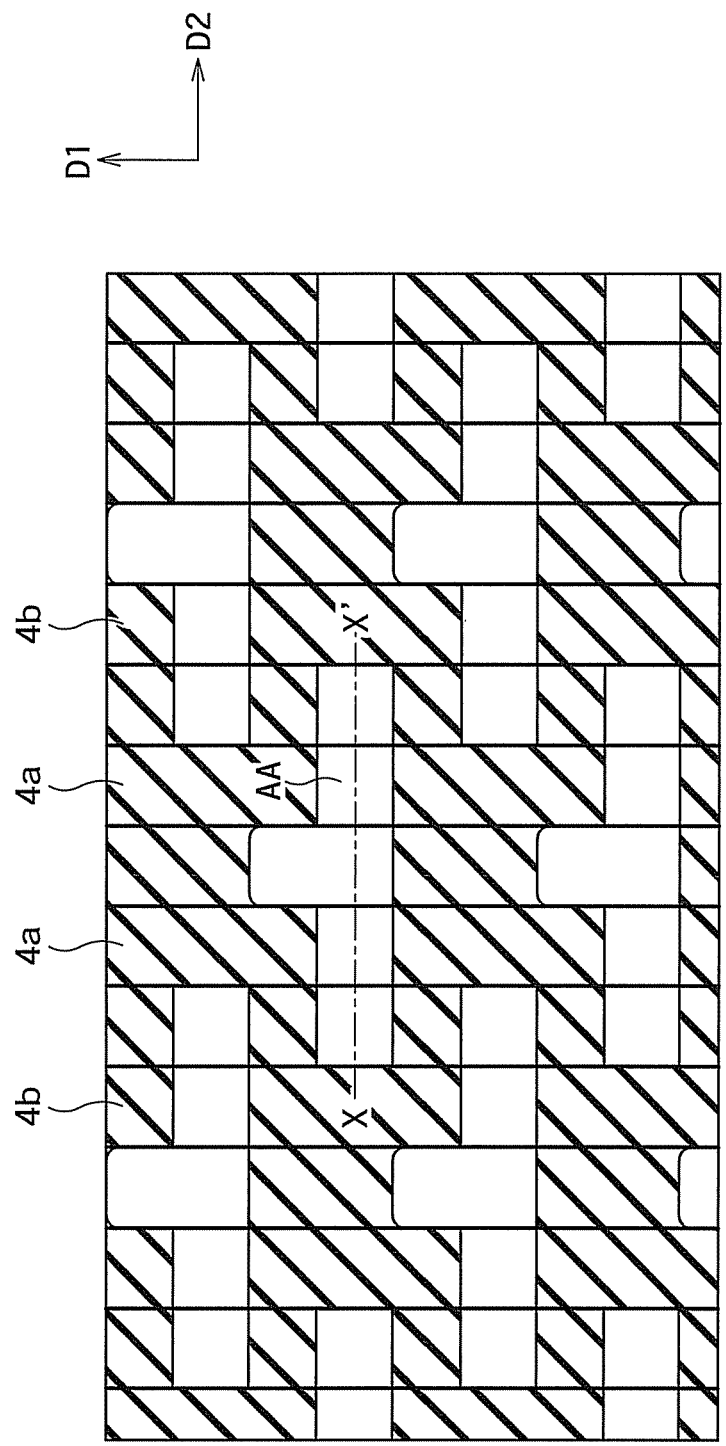
FIG. 28 is a plane view for illustrating the example of step of the method of manufacturing the semiconductor memory device 100 shown in FIG. 1, is continuous from FIG. 27.

Then, as shown in FIG. 11, a metal, such as TiN and W, is buried, and then, the part of the buried metal below the surface of the semiconductor substrate 1 is recessed. In this way, the gate electrodes 4a and 4b are buried in the grooves 2a and 2b with the gate insulating films 3a and 3b formed on the inner surfaces thereof (FIG. 28).

Figure 12:
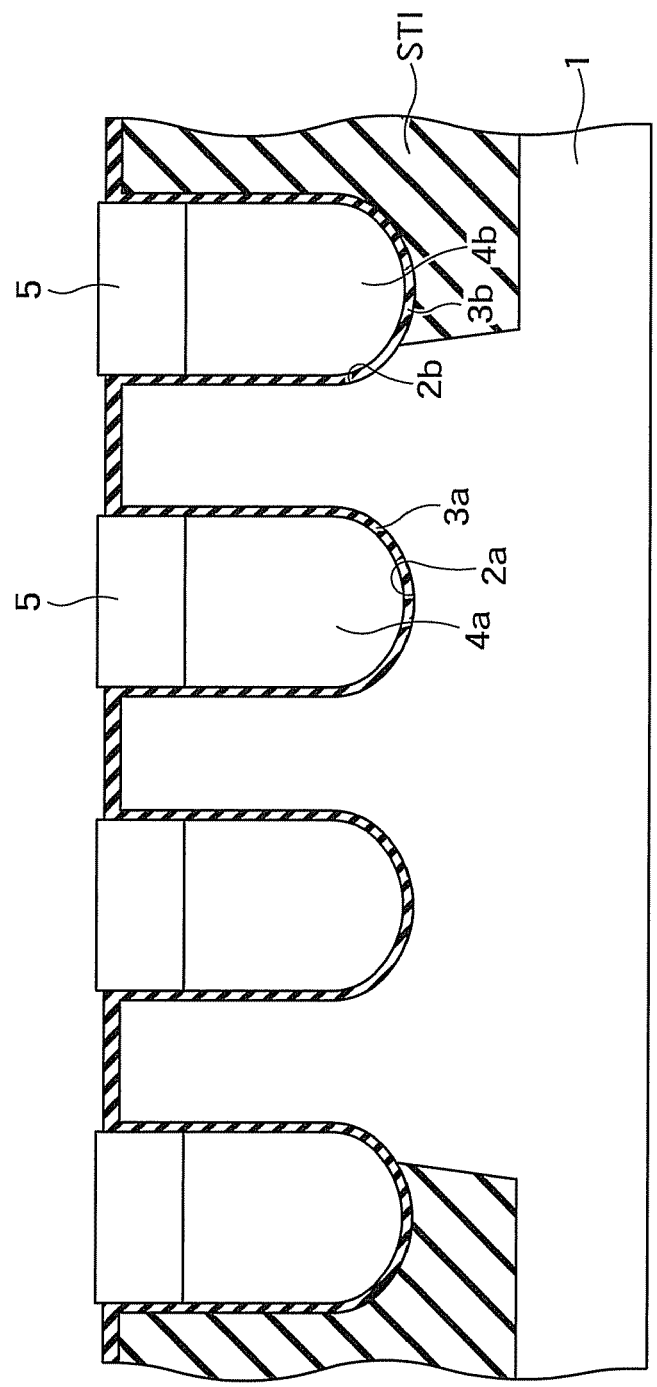
FIG. 12 is a cross-sectional view for illustrating the example of step of the method of manufacturing the semiconductor memory device 100 shown in FIG. 1, is continuous from FIG. 11.

Then, as shown in FIG. 12, a SiN film 5 is deposited on the semiconductor substrate 1 and the gate electrodes 4a and 4b by CVD, for example, and then, the SiN film 5 on the semiconductor substrate 1 is removed by CMP.

In this step, a gate electrode material and a hard mask for the peripheral circuit are deposited, and a gate electrode (not shown) for the peripheral circuit is formed by lithography and RIE.

Figure 13:
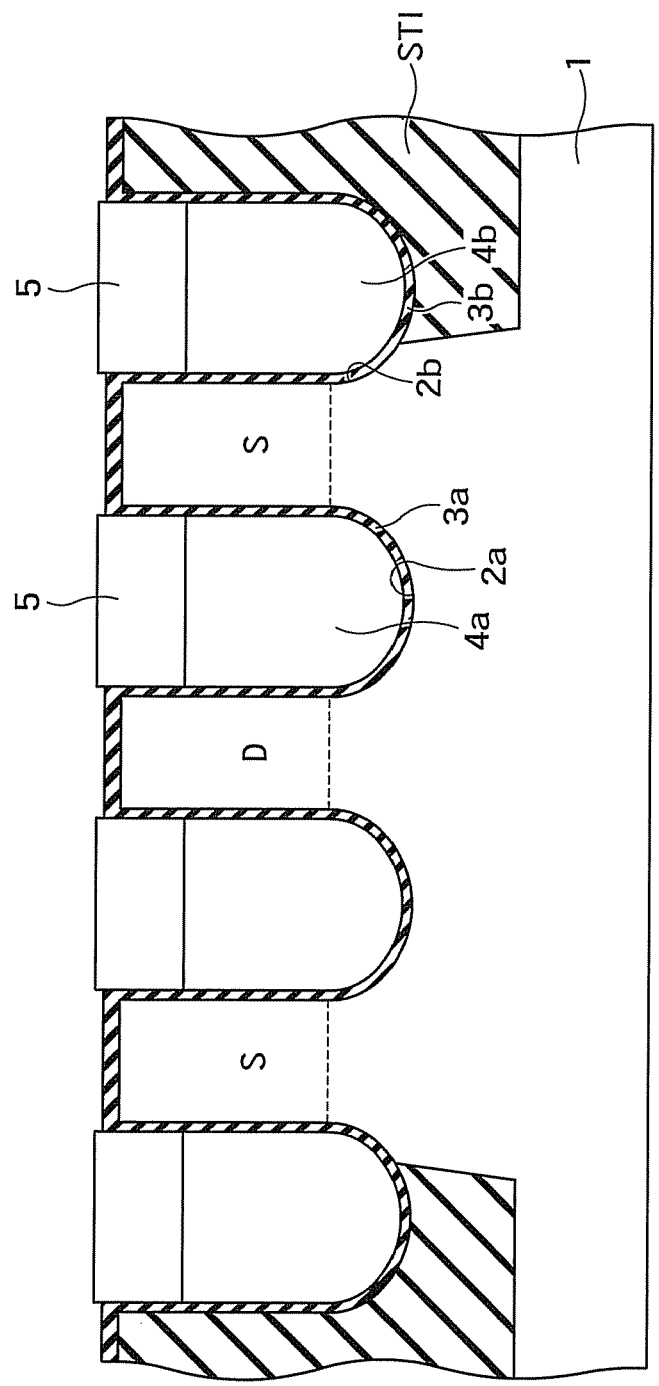
FIG. 13 is a cross-sectional view for illustrating the example of step of the method of manufacturing the semiconductor memory device 100 shown in FIG. 1, is continuous from FIG. 12.

Then, as shown in FIG. 13, the source region "S" and the drain region "D" are formed by lithography and ion implantation, for example.

In this way, the source region "S" and the drain region "D" are formed on the upper surface of the active area "AA" of the semiconductor substrate 1 on the opposite sides of the gate electrode 4a.

Figure 14:
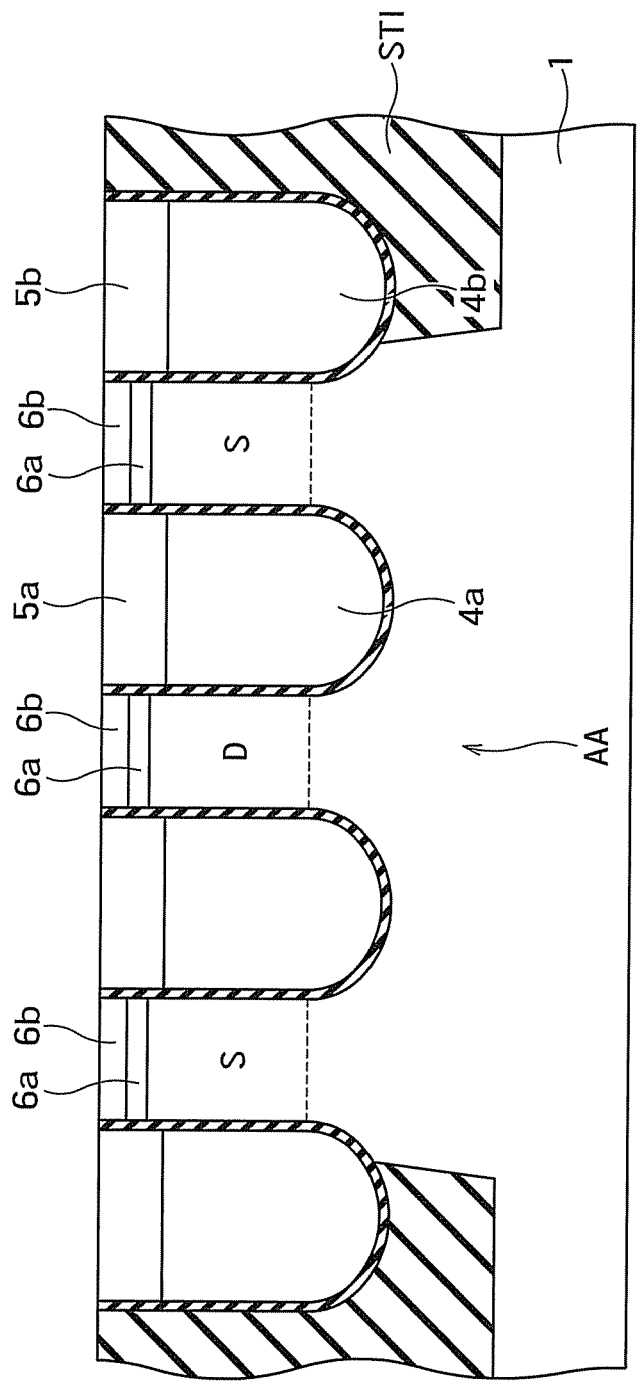
FIG. 14 is a cross-sectional view for illustrating the example of step of the method of manufacturing the semiconductor memory device 100 shown in FIG. 1, is continuous from FIG. 13.

Then, as shown in FIG. 14, the silicide film 6a and the barrier metal layer 6b are formed only on the semiconductor substrate 1 by depositing a Ti film or a TiN film by sputtering, forming a silicide film by silicidation, and then performing a treatment with hydrogen peroxide and sulfuric acid solution (SH peeling). Then, the surface of the barrier metal layer 6b is planarized by CMP.

In this way, before formation of the MTJ element "M", the silicide film 6a is formed on the source region "S" and the drain region "D", and the barrier metal film 6b is formed on the silicide film 6a.

This step may be performed at the same time with deposition of the MTJ layer, and the silicidation step, the SH peeling step or other steps may be omitted.

Figure 15:
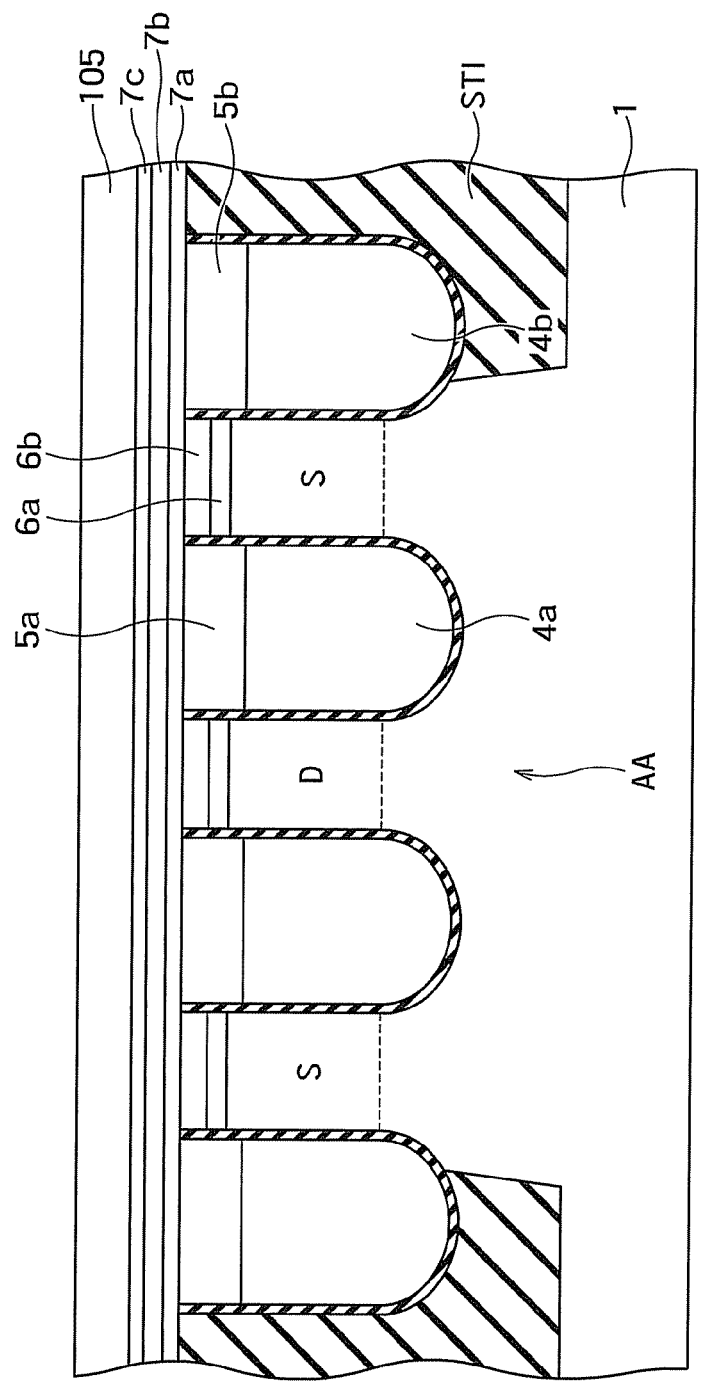
FIG. 15 is a cross-sectional view for illustrating the example of step of the method of manufacturing the semiconductor memory device 100 shown in FIG. 1, is continuous from FIG. 14.

Then, as shown in FIG. 15, a base layer (not shown), the first ferromagnetic layer 7a, the barrier layer 7b, the second ferromagnetic layer 7c and the hard mask layer 105 are each deposited by sputtering, for example.

Figure 16:
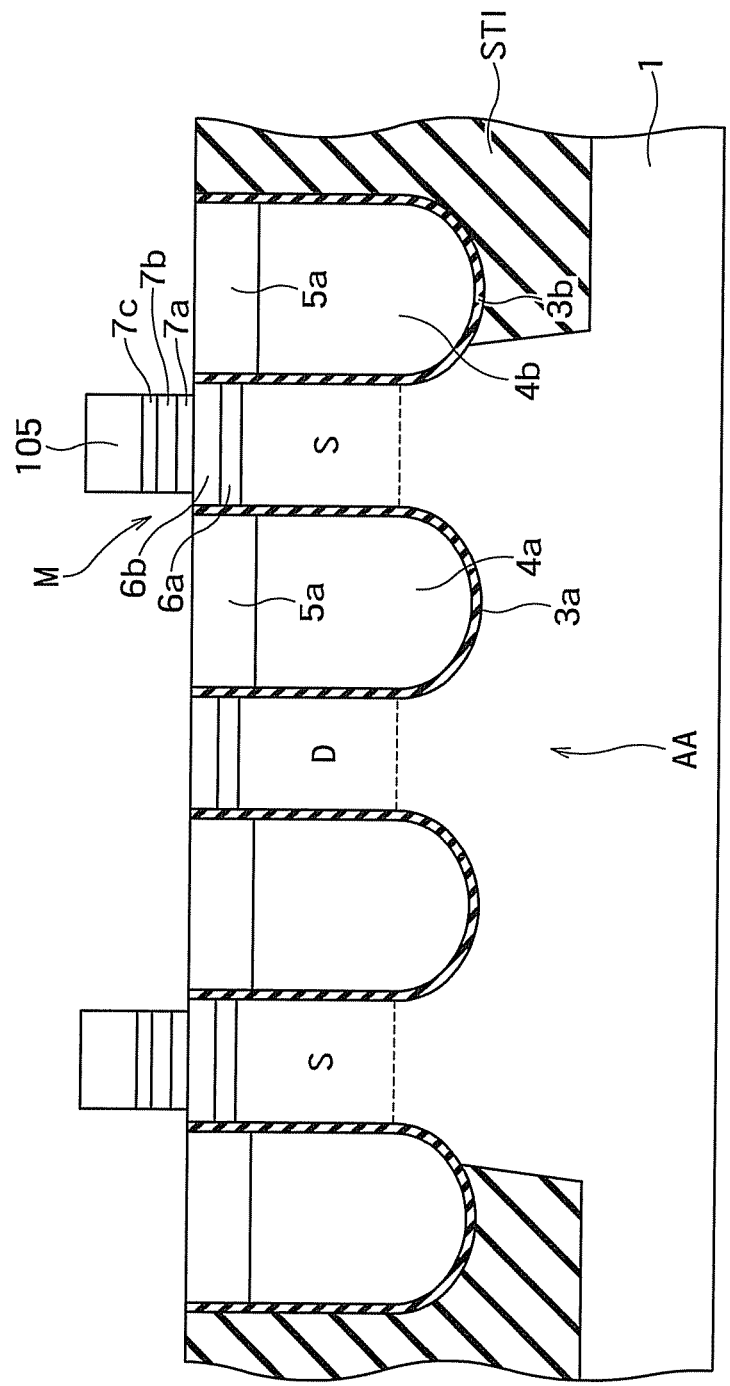
FIG. 16 is a cross-sectional view for illustrating the example of step of the method of manufacturing the semiconductor memory device 100 shown in FIG. 1, is continuous from FIG. 15.

Then, as shown in FIG. 16, the hard mask layer 105 is selectively etched by lithography or RIE, for example, and then, the first ferromagnetic layer 7a, the barrier layer 7b and the second ferromagnetic layer 7c are etched by ion milling using the remaining hard mask layer 105 as a mask.

Figure 29:
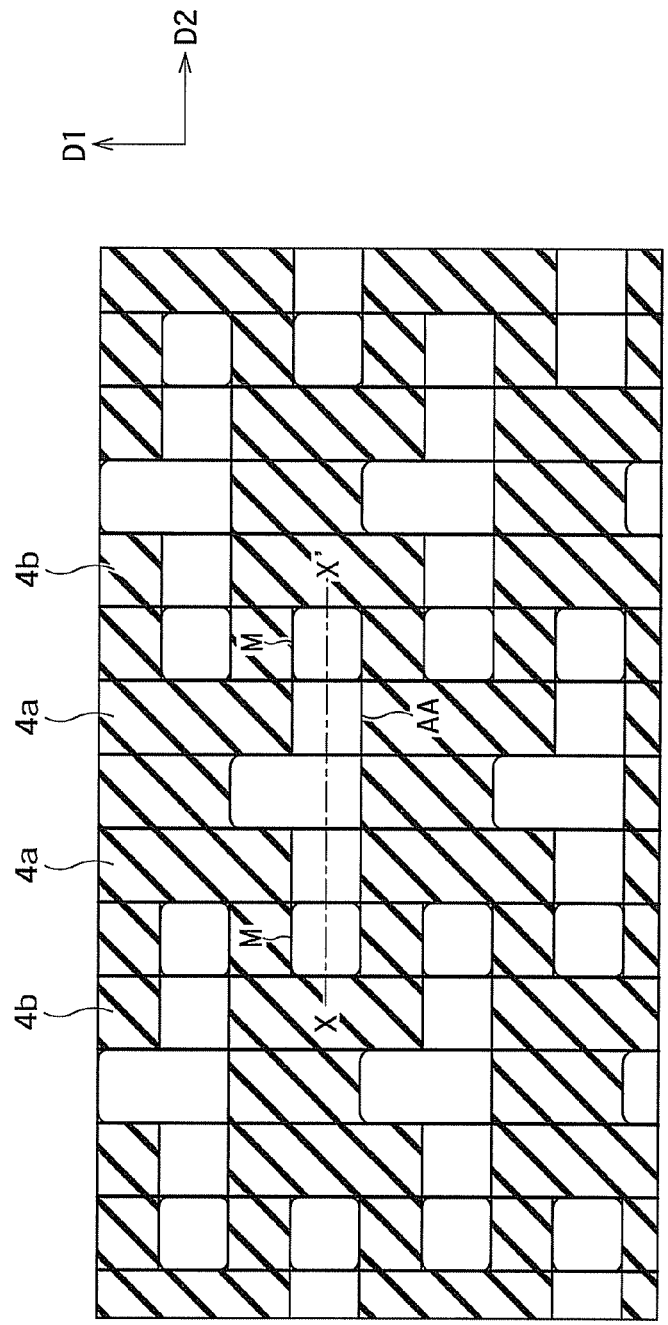
FIG. 29 is a plane view for illustrating the example of step of the method of manufacturing the semiconductor memory device 100 shown in FIG. 1, is continuous from FIG. 28.

In this way, the MTJ element "M" having a variable resistance that varies with the direction of magnetization that is electrically connected to the source region "S" at one end is formed over the source region "S" (FIG. 29).

Figure 17:
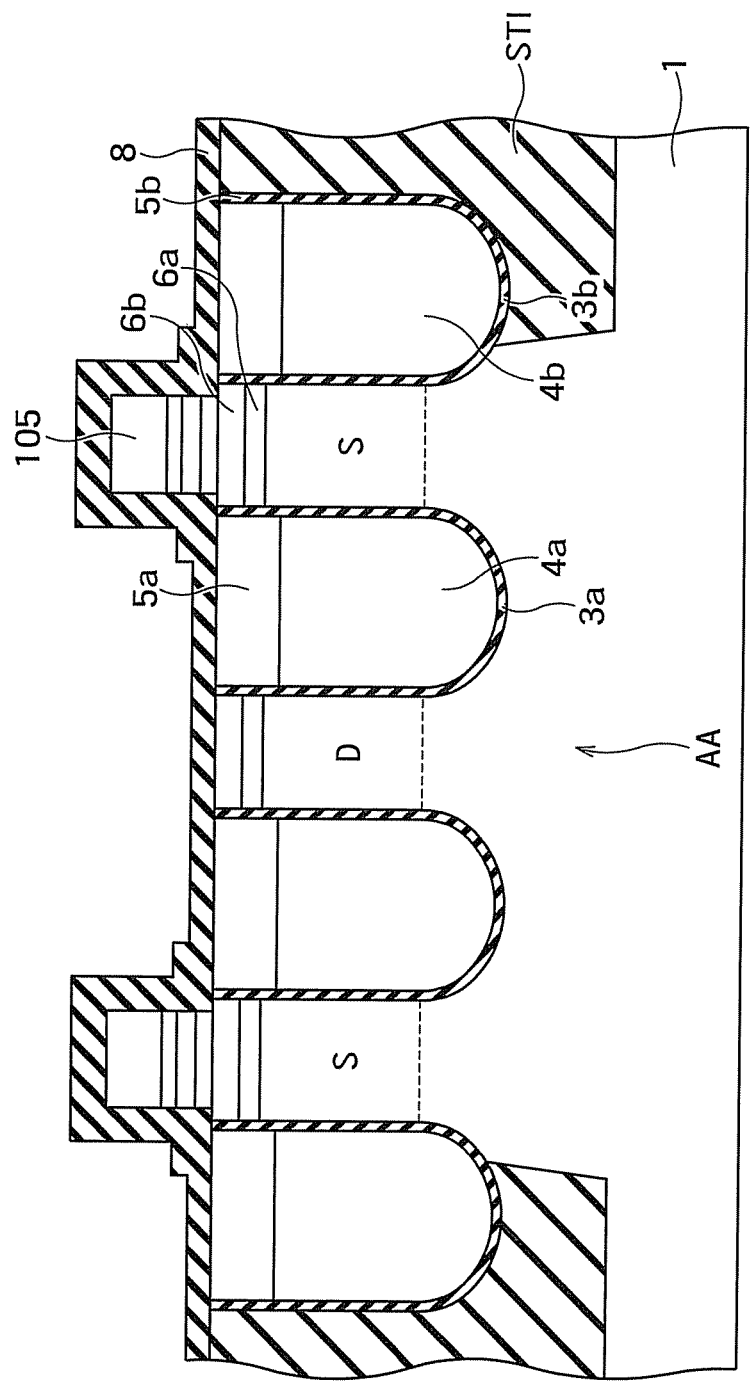
FIG. 17 is a cross-sectional view for illustrating the example of step of the method of manufacturing the semiconductor memory device 100 shown in FIG. 1, is continuous from FIG. 16.

Then, as shown in FIG. 17, a protective film 8 that serves as a protection against oxidation of SiN or the like or an adverse effect of water, a reducing gas, hydrogen or the like is formed by CVD or atomic layer deposition (ALD), for example.

Figure 18:
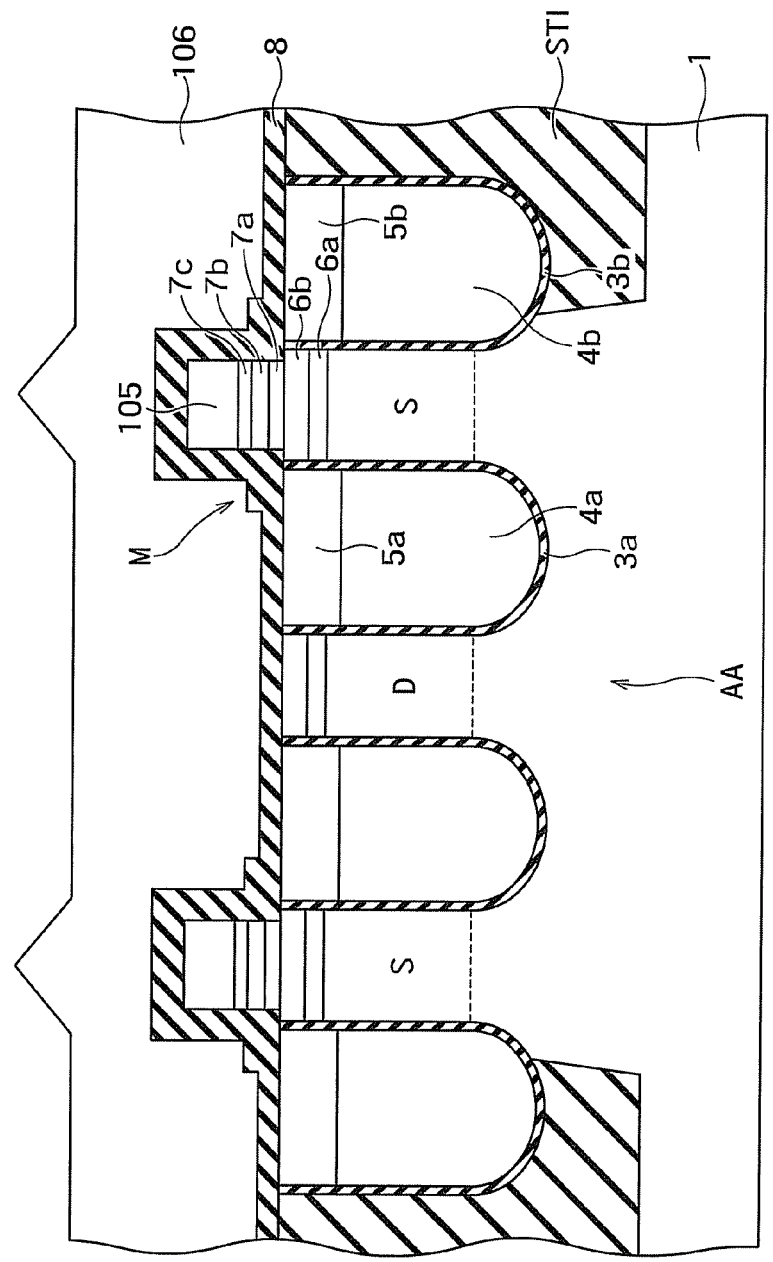
FIG. 18 is a cross-sectional view for illustrating the example of step of the method of manufacturing the semiconductor memory device 100 shown in FIG. 1, is continuous from FIG. 17.

Then, as shown in FIG. 18, an interlayer insulating film 106 is deposited on the semiconductor substrate 1 by CVD or application, for example, thereby burying the step formed by the MTJ element "M".

Figure 19:
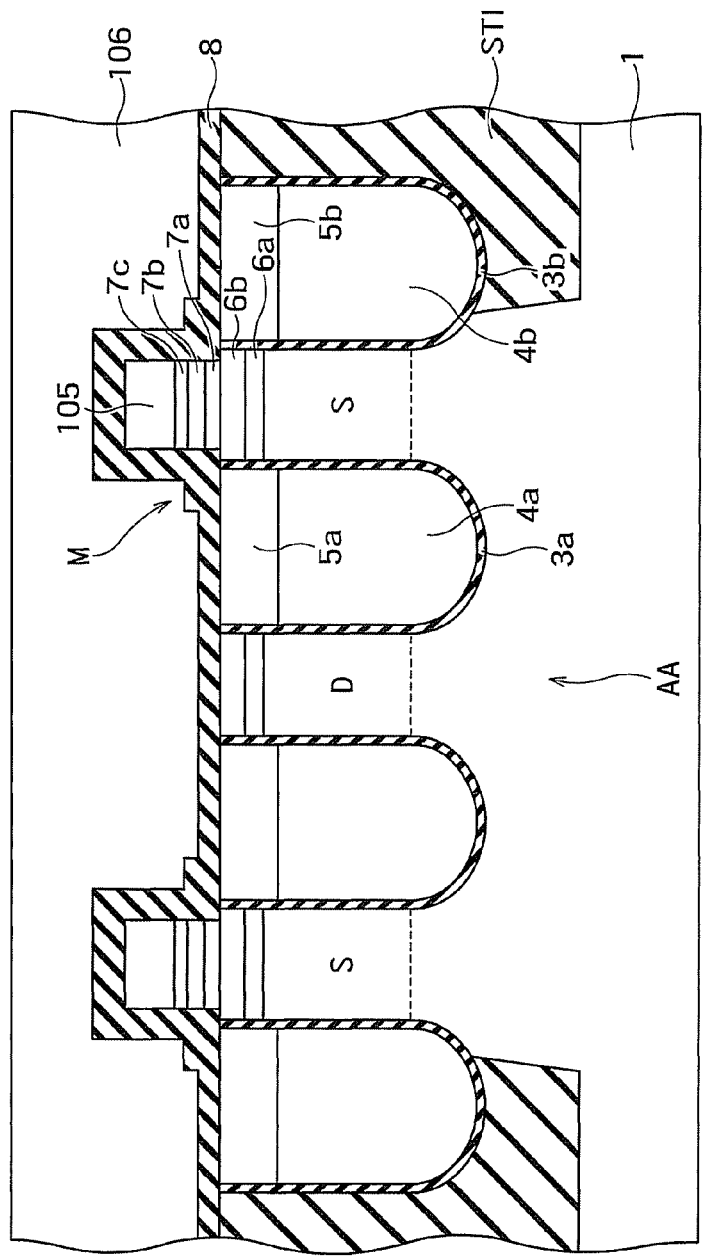
FIG. 19 is a cross-sectional view for illustrating the example of step of the method of manufacturing the semiconductor memory device 100 shown in FIG. 1, is continuous from FIG. 18.

Then, as shown in FIG. 19, the step on the interlayer insulating film 106 formed by the MTJ element "M" is flattened by CMP, for example.

Figure 20:
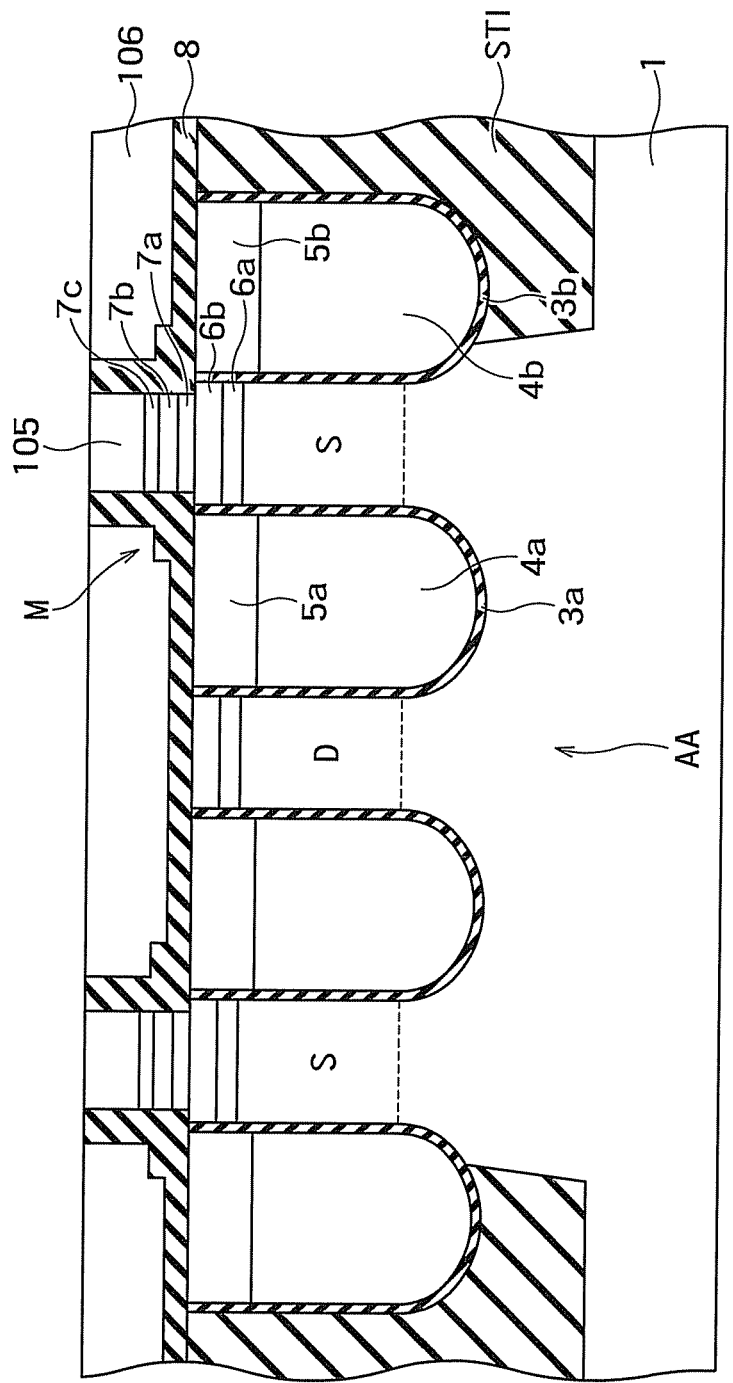
FIG. 20 is a cross-sectional view for illustrating the example of step of the method of manufacturing the semiconductor memory device 100 shown in FIG. 1, is continuous from FIG. 19.

Then, as shown in FIG. 20, the upper surface of the conductive hard mask 105 is exposed by RIE or ion milling, for example.

Figure 21:
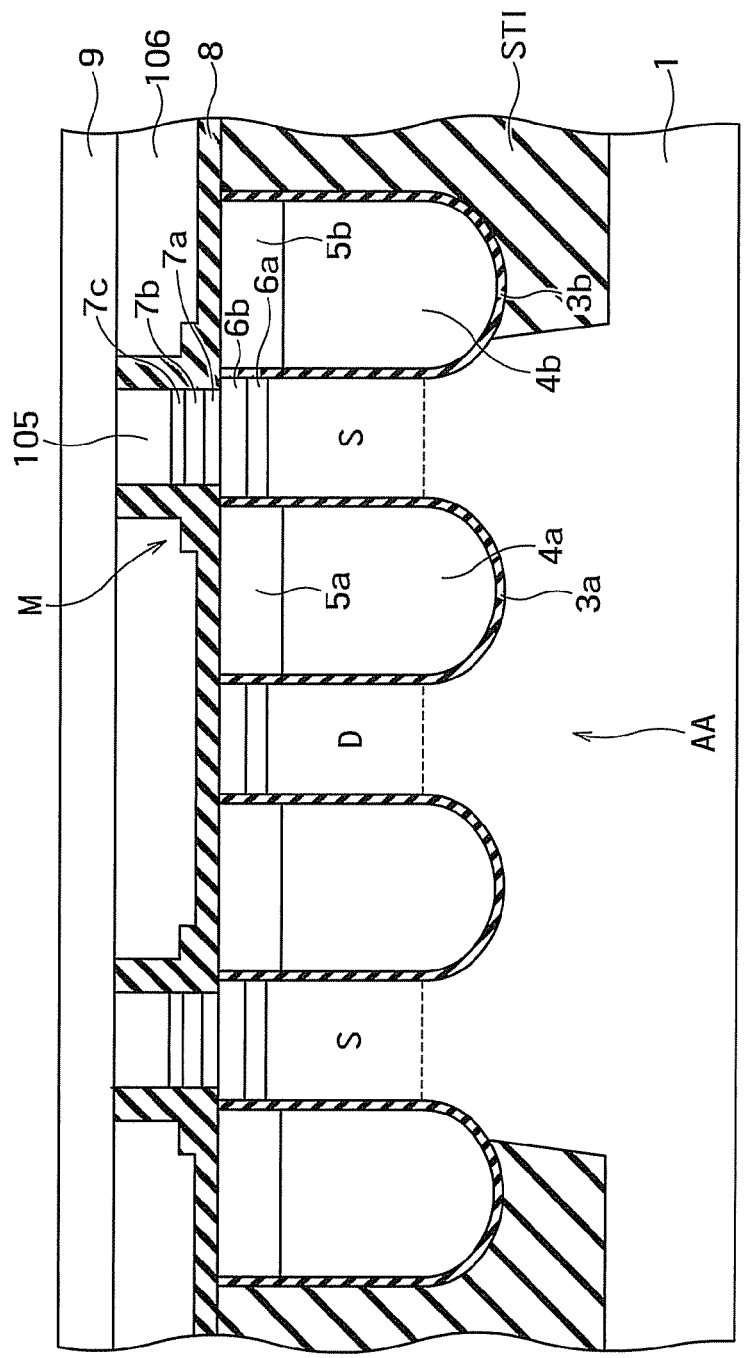
FIG. 21 is a cross-sectional view for illustrating the example of step of the method of manufacturing the semiconductor memory device 100 shown in FIG. 1, is continuous from FIG. 20.

Then, as shown in FIG. 21, the upper electrode 9 is formed by depositing TiN on the conductive hard mask 105 by sputtering, for example.

Figure 22:
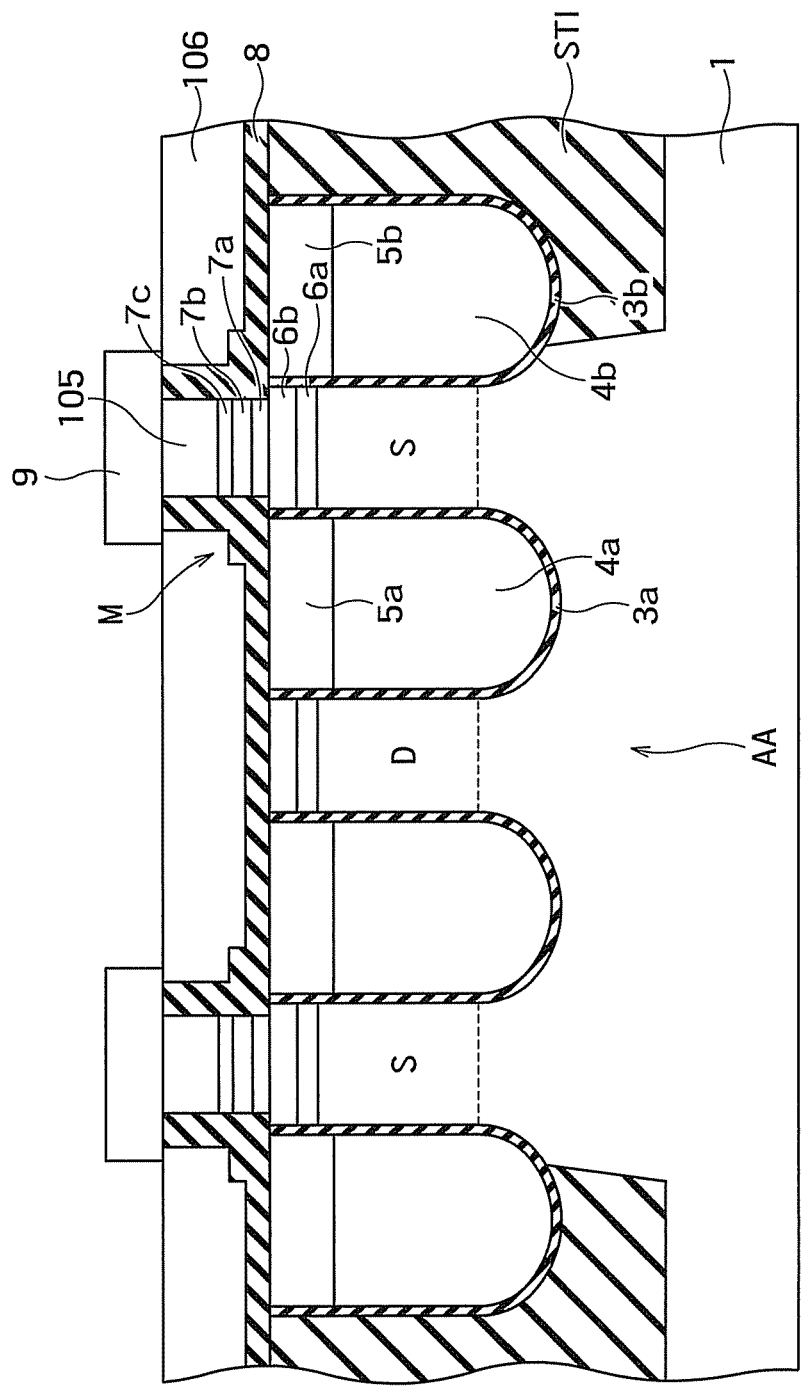
FIG. 22 is a cross-sectional view for illustrating the example of step of the method of manufacturing the semiconductor memory device 100 shown in FIG. 1, is continuous from FIG. 21.

Then, as shown in FIG. 22, the upper electrode 9 is selectively etched by lithography, RIE or milling, for example.

Figure 23:
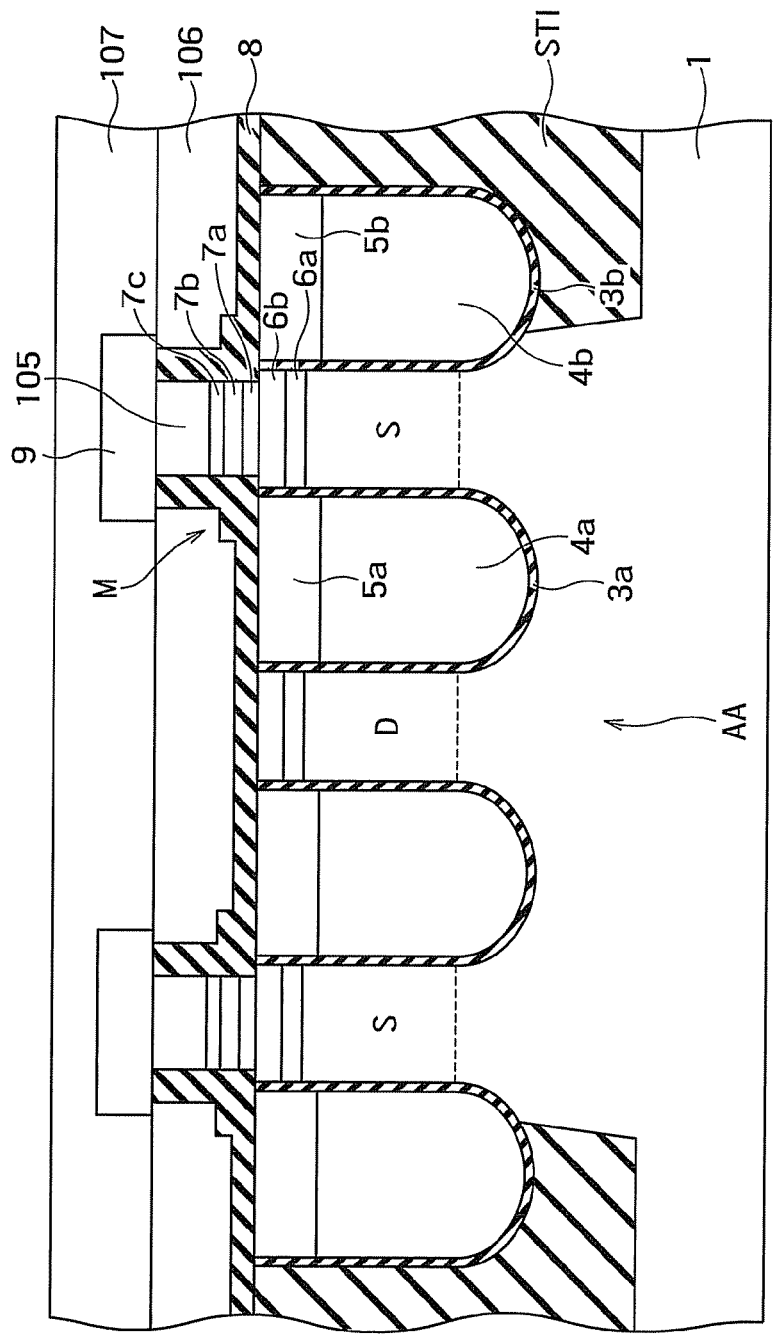
FIG. 23 is a cross-sectional view for illustrating the example of step of th2 method of manufacturing the semiconductor memory device 100 shown in FIG. 1, is continuous from FIG. 22.

Then, as shown in FIG. 23, an interlayer insulating film 107 is formed on the upper electrode 9 and the interlayer insulating film 106 by CVD or application, for example.

Figure 24:
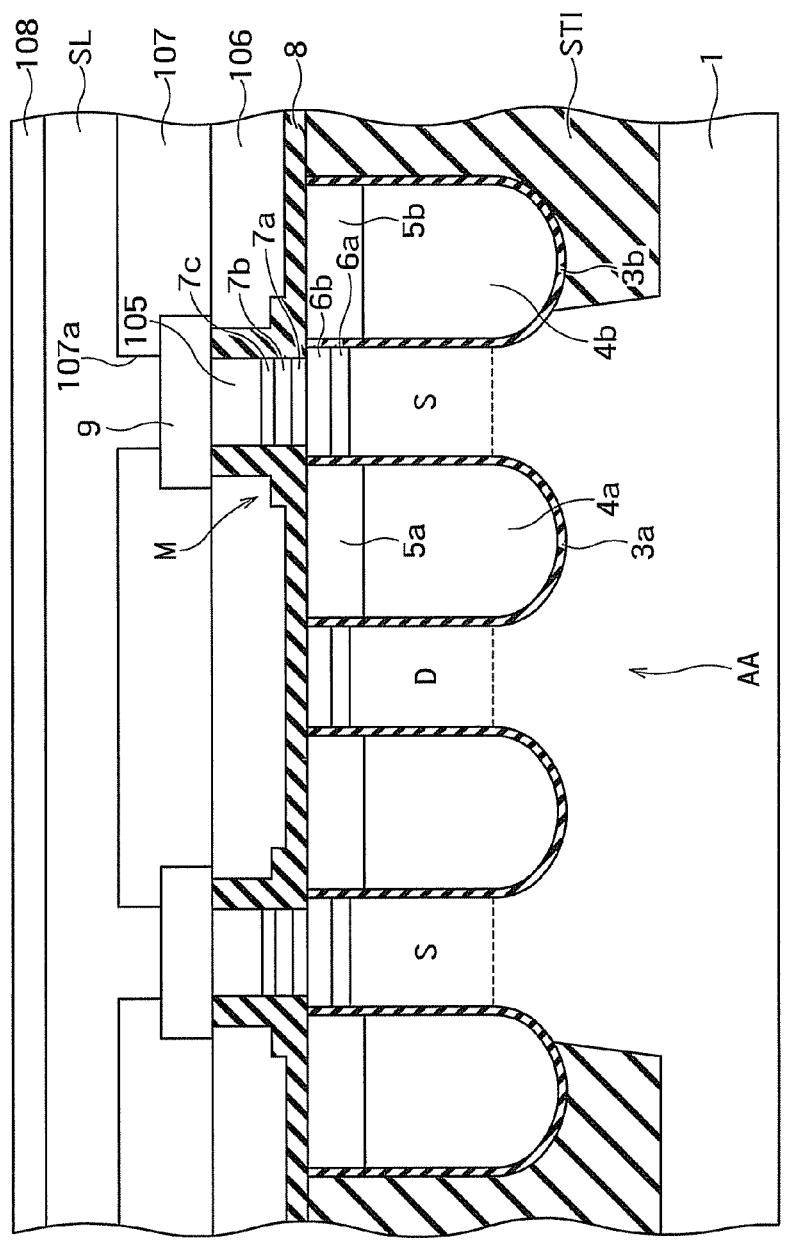
FIG. 24 is a cross-sectional view for illustrating the example of step of the method of manufacturing the semiconductor memory device 100 shown in FIG. 1, is continuous from FIG. 23.

Then, as shown in FIG. 24, a contact groove 107a is formed in the interlayer insulating film 107 at a position above the upper electrode 9 by lithography and RIE, for example. Furthermore, blanket tungsten is deposited and a hard mask 108 of SiN is formed by sputtering and CVD. Then, the hard mask 108 and the tungsten are each etched by lithography and RIE.

Figure 30:
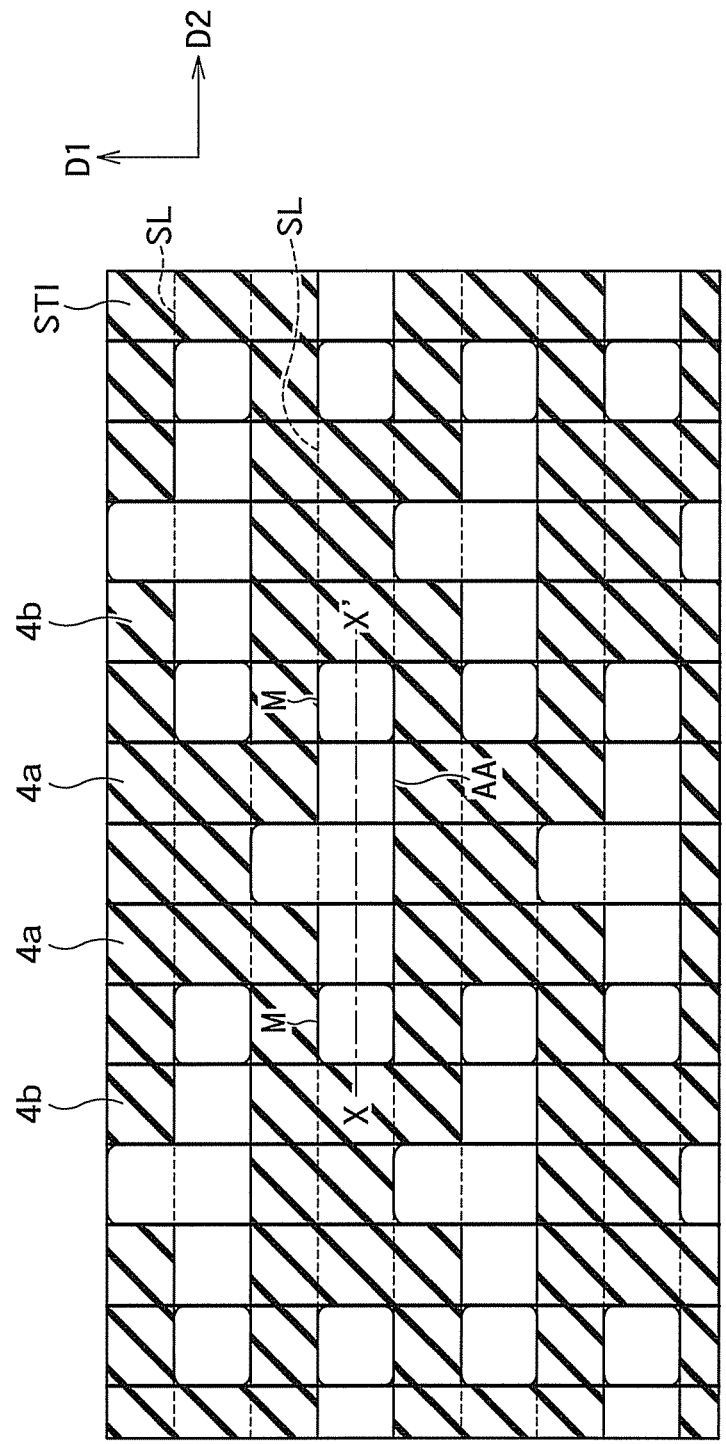
FIG. 30 is a plane view for illustrating the example of step of the method of manufacturing the semiconductor memory device 100 shown in FIG. 1, is continuous from FIG. 29.

In this way, the source line "SL" electrically connected to the other end of the MTJ element is formed (FIG. 30).

In addition, SiN is deposited on the side walls of the wire for SAC, and a RIE processing is performed on the other parts than the side walls.

Figure 25:
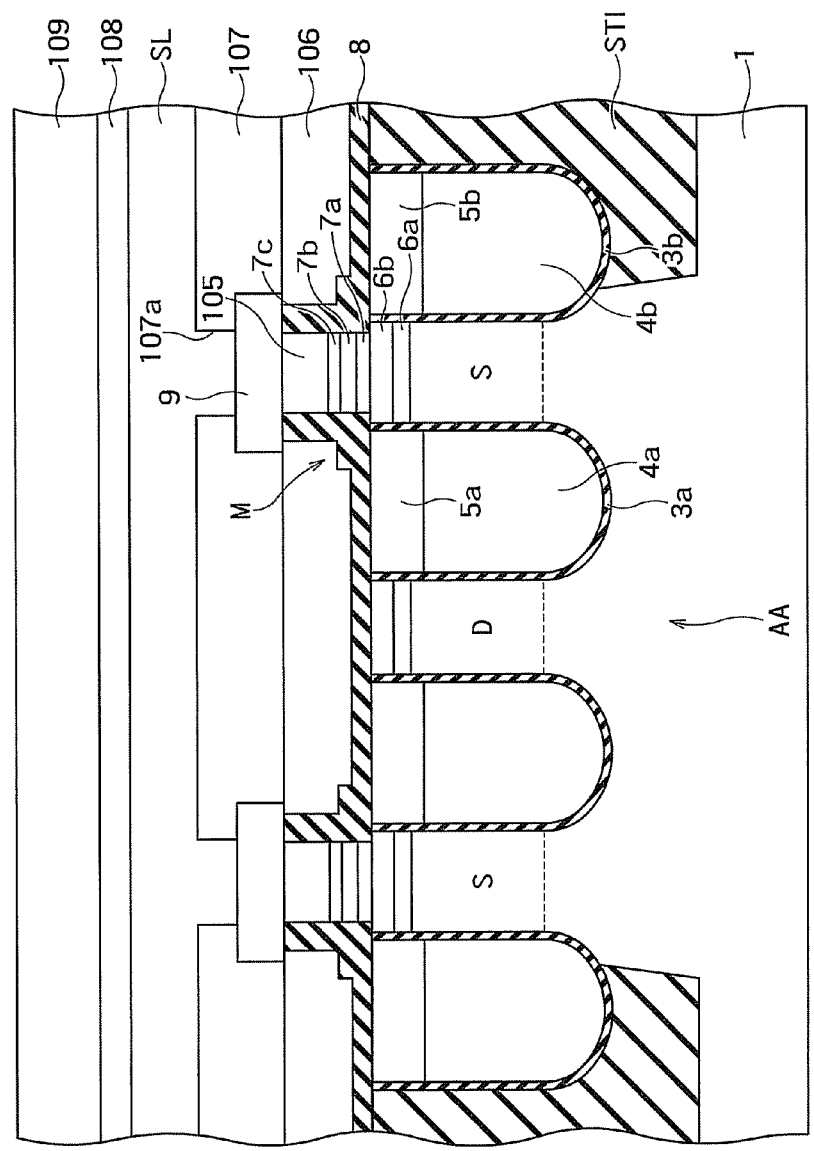
FIG. 25 is a cross-sectional view for illustrating the example of step of the method of manufacturing the semiconductor memory device 100 shown in FIG. 1, is continuous from FIG. 24.

Then, as shown in FIG. 25, an interlayer insulating film 109 is deposited on the source line "SL" by CVD or application, for example.

Figure 26:
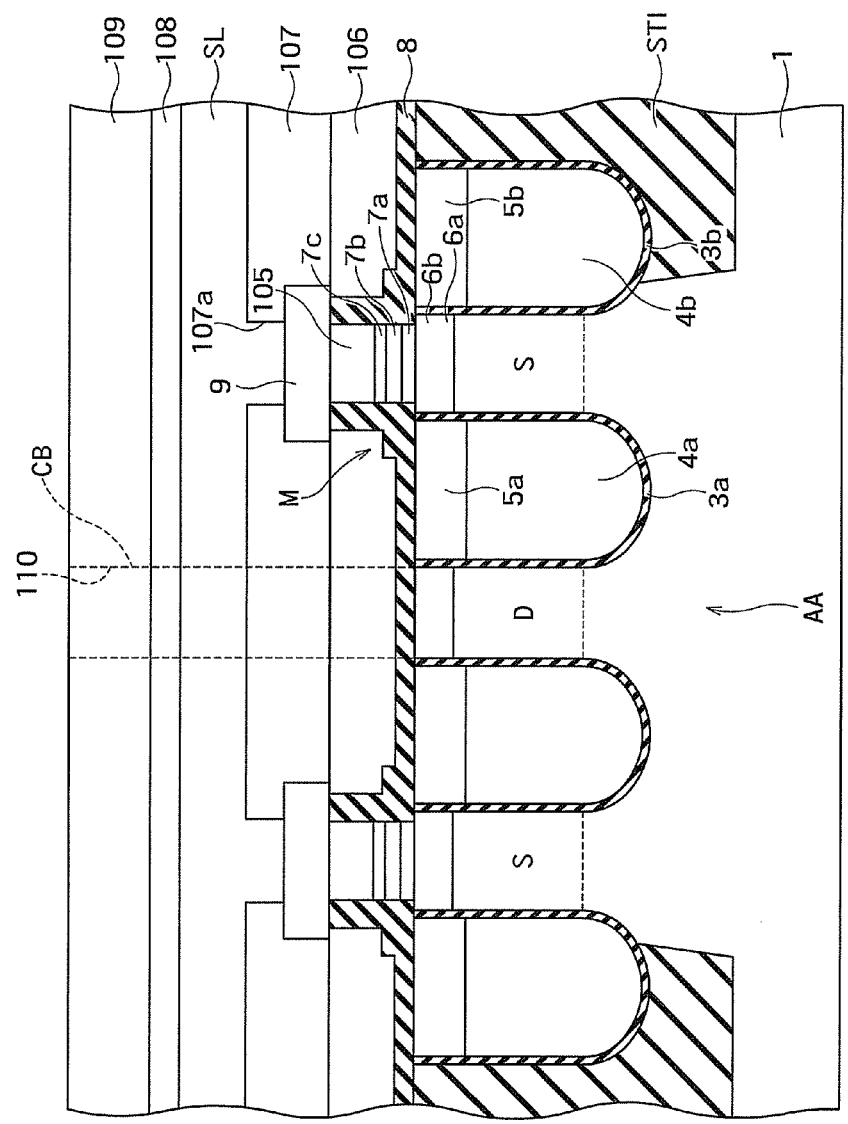
FIG. 26 is a cross-sectional view for illustrating the example of step of the method of manufacturing the semiconductor memory device 100 shown in FIG. 1, is continuous from FIG. 25.
Figure 31:
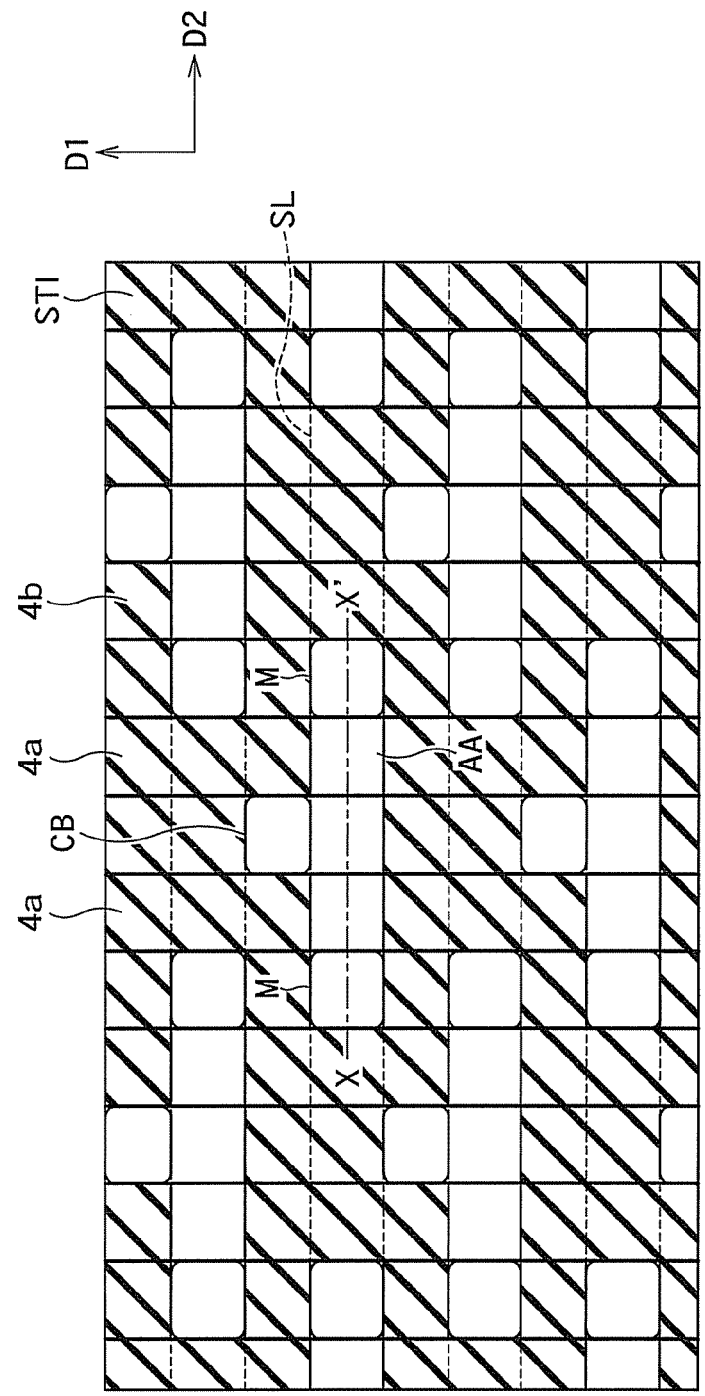
FIG. 31 is a plane view for illustrating the example of step of the method of manufacturing the semiconductor memory device 100 shown in FIG. 1, is continuous from FIG. 30.

Then, as shown in FIG. 26, a bit line contact 110 is formed by lithography and RIE, for example, and tungsten is buried in the bit line contact 110 by sputtering, CVD or CMP. In this way, the bit line contact wire "CB" electrically connected to the extension of the drain region "D" in the first direction D1 is formed (FIG. 31).

If the SiN has a selection ratio to provide a SAC structure, the RIE processing in this case can be made finer. In this step, the source and drain regions and the gate contact of a transistor in the peripheral circuit described above can be formed at the same time.

Figure 32:
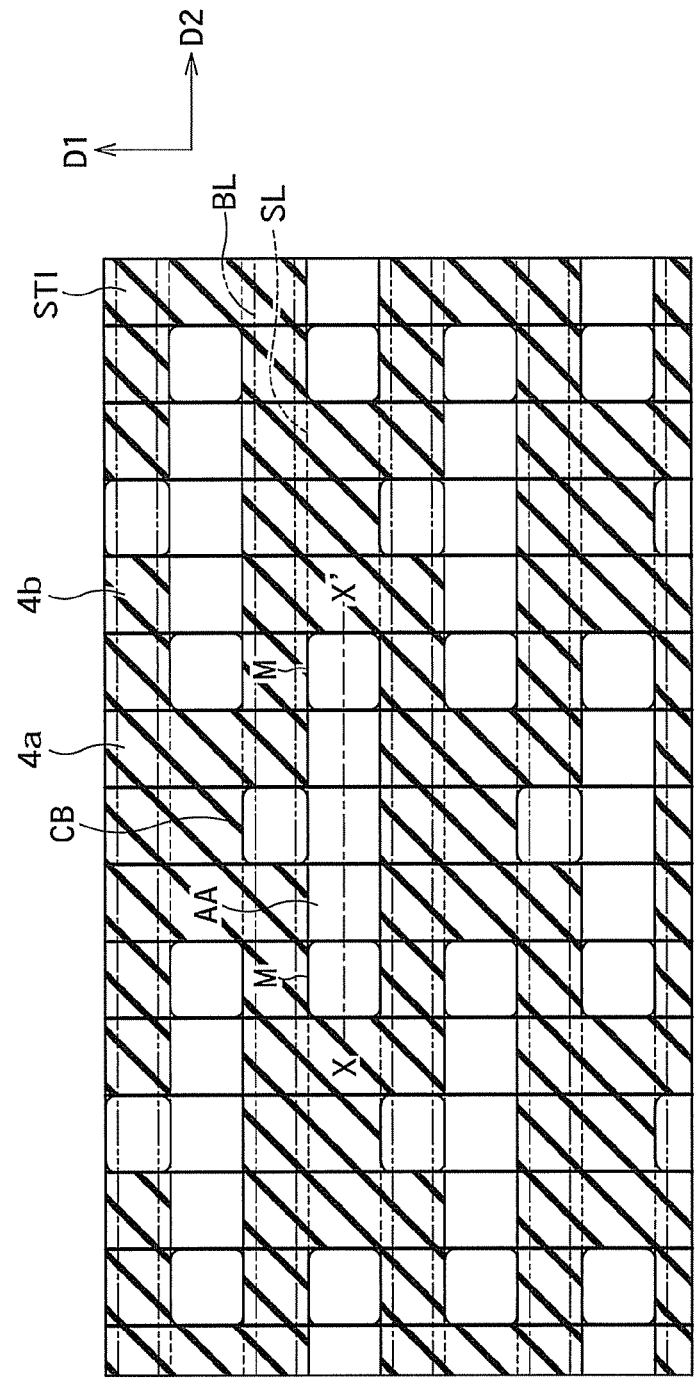
FIG. 32 is a plane view for illustrating the example of step of the method of manufacturing the semiconductor memory device 100 shown in FIG. 1, is continuous from FIG. 31.

Then, a bit line groove (not shown) is formed by lithography and RIE, for example. Then, a barrier metal and a Cu plating are deposited, and then, the surface is flattened by CMP. In this way, the bit line "BL" electrically connected to the drain region "D" is formed (FIG. 32). In this step, wiring of the peripheral circuit can also be formed.

Through the steps described above, the semiconductor memory device 100 shown in FIG. 1 is completed.

As described above, in the structure of the semiconductor memory device 100 according to the first embodiment, the gate of the transistor "Tr" is buried in the semiconductor substrate 1, and the lower electrode (barrier metal film) 6b of the MTJ element "M" is formed on the silicide film 6a formed on the semiconductor substrate 1. Therefore, no seam occurs in the tungsten plug below the MTJ element "M".

In particular, since flattening by CMP is performed before the MTJ element "M" and the base film are formed as described above, the effect of irregularities on the surface of the silicide film 6a can be removed.

Furthermore, according to the method of manufacturing the semiconductor memory device 100, the process of forming the base film does not involve burying of a high gate step and CMP. Therefore, a step is less likely to occur because of over etching in CMP.

Thus, the MTJ element "M" can be substantially formed on a flat part, and the effect of steps on the MTJ characteristics can be removed.

As described above, the semiconductor memory device according to the first embodiment and the method of manufacturing the same can improve the characteristics of the MTJ element.

Second Embodiment

In the first embodiment, an example of the configuration of the semiconductor memory device in which the direction of extension of the gate electrode is perpendicular to the direction of extension of the active area (channel direction of the cell transistor) has been described.

In a second embodiment, an example of the configuration in which the direction of extension of the gate electrode is oblique to the direction of extension of the active area (channel direction of the cell transistor) will be described.

Figure 33:
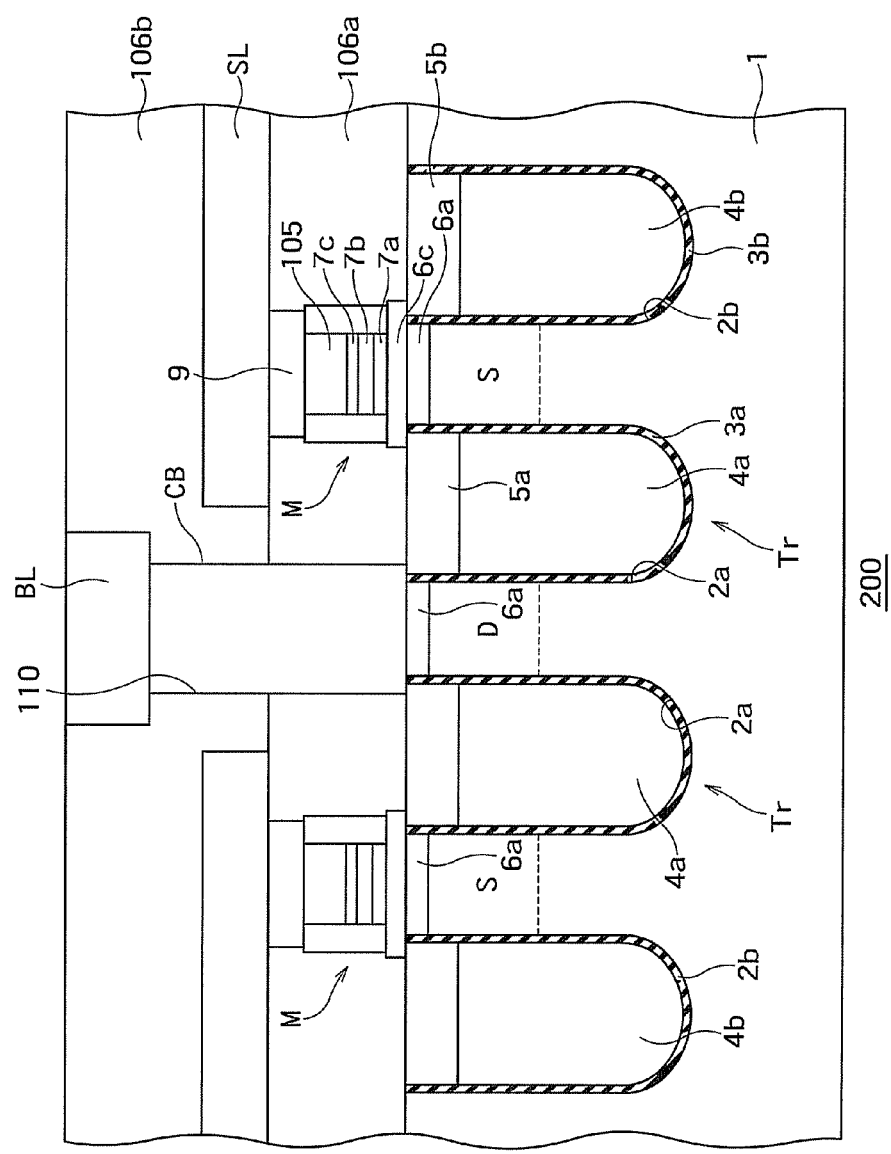
FIG. 33 is a cross-sectional view showing a configuration of a semiconductor memory device 200 according to the second embodiment.

FIG. 33 is a cross-sectional view showing a configuration of a semiconductor memory device 200 according to the second embodiment. In FIG. 33, the same reference numerals as those in FIG. 1 denote the same components as those in the first embodiment.

As shown in FIG. 33, as with the semiconductor memory device 100 according to the first embodiment, the semiconductor memory device (MRAM) 200 includes a semiconductor substrate 1, a cell transistor "Tr", a silicide film 5a, a barrier metal film 5b, an MTJ element "M", a source line "SL", a bit line "BL" and a bit line contact wire "CB".

The semiconductor substrate 1 has an active area "AA" isolated by a element isolation area. The semiconductor substrate 1 contains silicon, for example.

As in the first embodiment, the cell transistor "Tr" has gate insulating films 3a and 3b deposited on the inner surfaces of grooves 2a and 2b formed in the upper surface of the semiconductor substrate 1, gate electrodes 4a and 4b buried in the grooves 2a and 2b with the gate insulating films 3a and 3b deposited on the inner surfaces thereof, and a source region "S" and a drain region "D" formed on the upper surface of the active area "AA" of the semiconductor substrate 1 on the opposite sides of the gate electrode 4a.

The drain region "D" is shared by two transistors "Tr" in the example shown in FIG. 33.

The silicide film 6a is formed on the source region "S" and the drain region "D".

A lower electrode 6c is formed on the silicide film 6a. The upper surface of the lower electrode 6c is flattened by CMP or the like and thus is substantially flat, as described later. The lower electrode 6c is made of titanium, tantalum, tungsten, copper or a nitride film thereof, for example.

The MTJ element "M" is formed over the source region "S" and is electrically connected to the source region "S" at one end thereof. In the example shown in FIG. 33, the MTJ element "M" is electrically connected to the source region "S" at one end thereof via the silicide film 6a and the lower electrode 6c.

The source line "SL" is electrically connected to the other end of the MTJ element "M" via a conductive hard mask 105 and an upper electrode 9.

The bit line contact wire "CB" is formed over the drain region "D" with the silicide film 6a and the lower electrode 6c interposed therebetween.

The bit line "BL" is electrically connected to the drain region "D". In the example shown in FIG. 33, the bit line "BL" is electrically connected to the drain region "D" via the silicide film 6a, the barrier metal film 6b and the bit line contact wire "CB". The bit line "BL" is disposed at a position shifted in the first direction D1 described later and therefore is shown by a dotted line.

In the example shown in FIG. 33, the bit line "BL" is positioned in a layer higher than the MTJ element "M" and the source line "SL".

The width of the gate electrodes 4a and 4b is smaller than the distance between adjacent gate electrodes.

The remainder of the configuration of the semiconductor memory device 200 is the same as that of the semiconductor memory device 100 according to the first embodiment.

Next, an example of a method of manufacturing the semiconductor memory device 200 configured as described above will be described. The method of manufacturing the semiconductor memory device 200 is basically the same as the method according to the first embodiment. In view of this, the method will be described with reference to plan views different from those used in the first embodiment.

Figure 37:
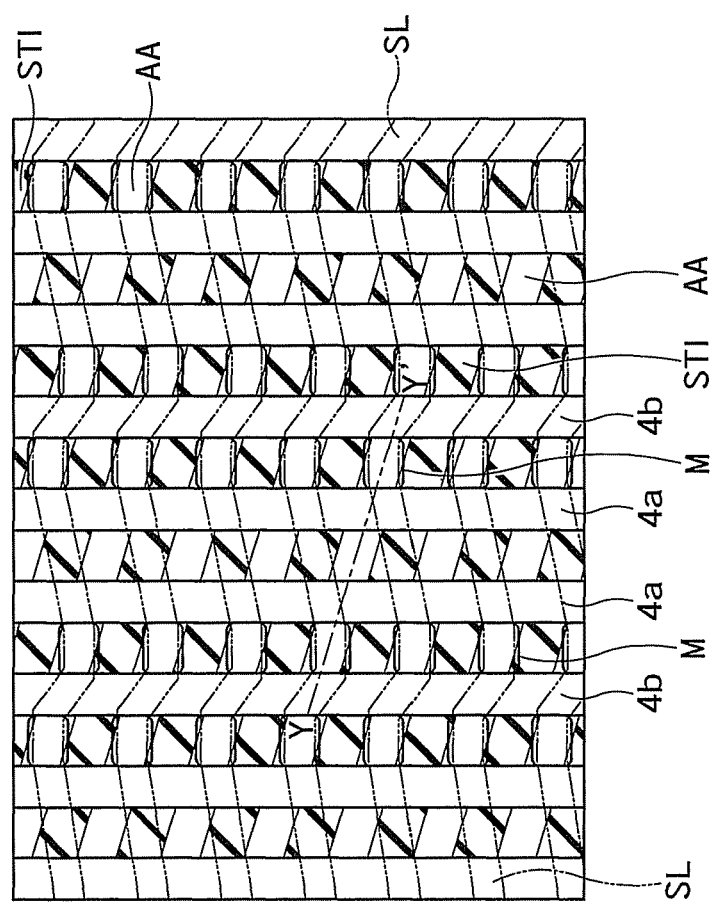
FIG. 37 is a plan view for illustrating the step of the method of manufacturing the semiconductor memory device 200 shown in FIG. 33, is continuous from FIG. 36.
Figure 38:
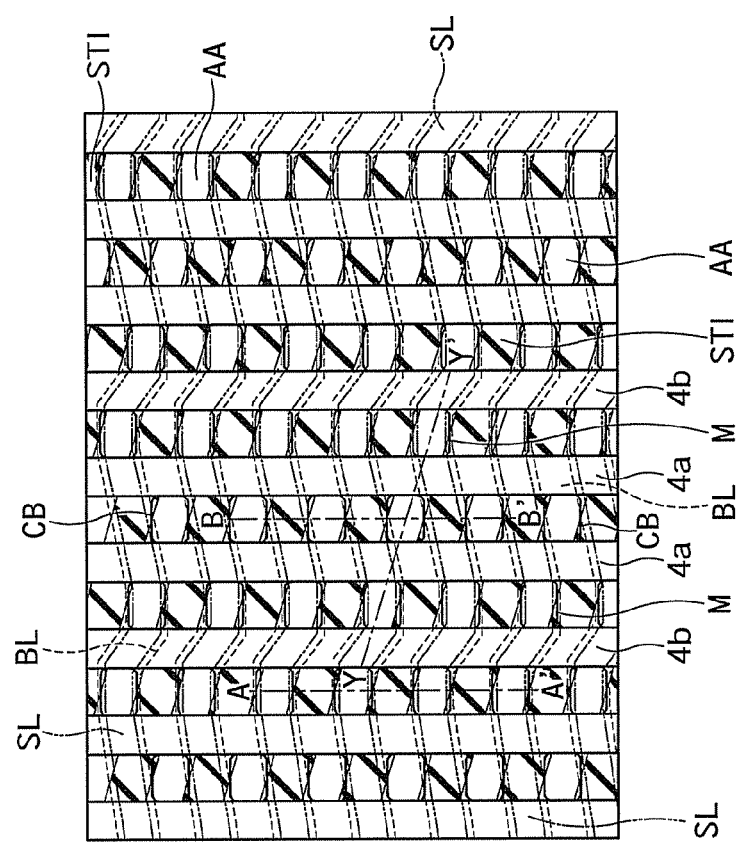
FIG. 38 is a plan view for illustrating the step of the method of manufacturing the semiconductor memory device 200 shown in FIG. 33, is continuous from FIG. 37.
Figure 39:
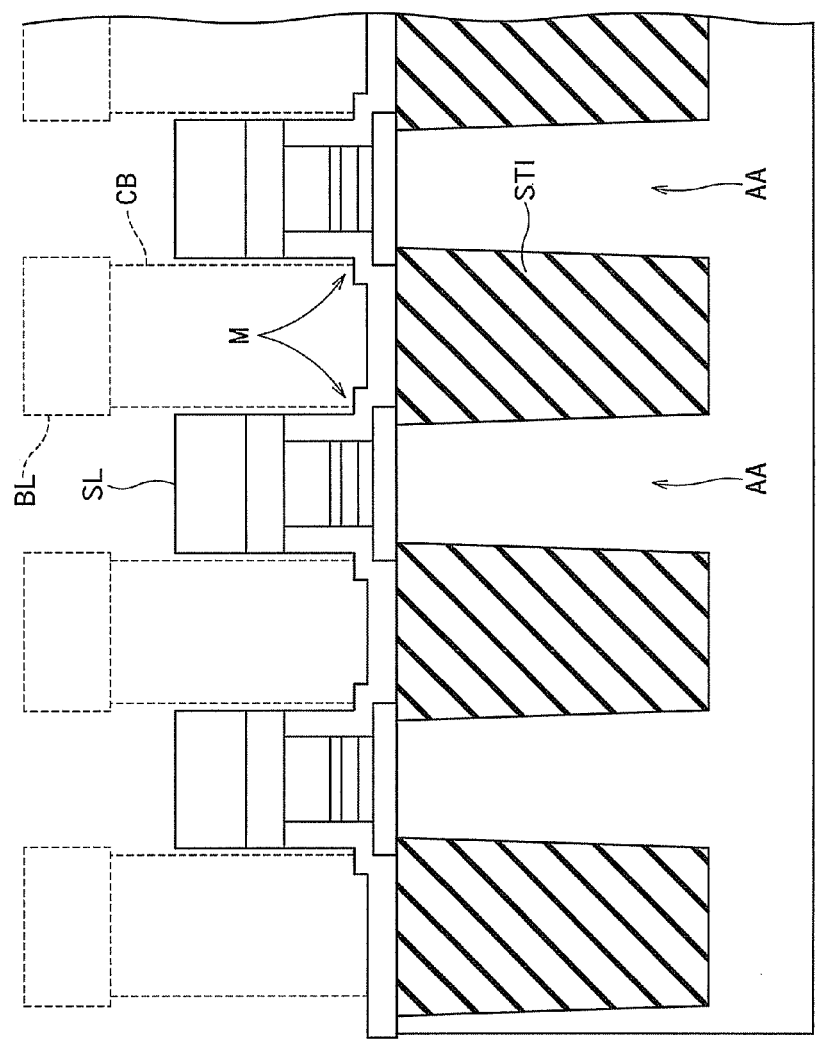
FIG. 39 is a cross-sectional view taken along the line A-A' in FIG. 38.
Figure 40:
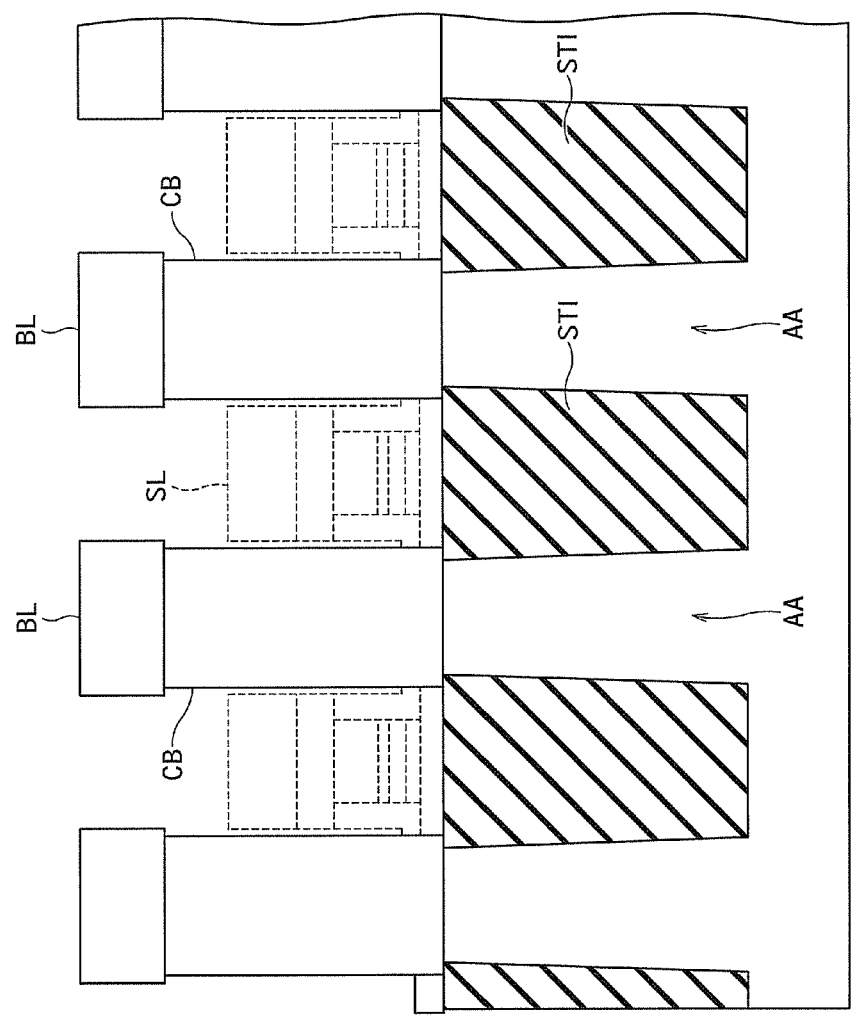
FIG. 40 is a cross-sectional view taken along the line B-B' in FIG. 38.

FIGS. 34 to 38 are plan views for illustrating different steps of the method of manufacturing the semiconductor memory device 200 shown in FIG. 33. FIG. 39 is a cross-sectional view taken along the line A-A' in FIG. 38. FIG. 40 is a cross-sectional view taken along the line B-B' in FIG. 38. The cross-sectional view of FIG. 33 is taken along the line Y-Y' in FIG. 38.

Figure 34:
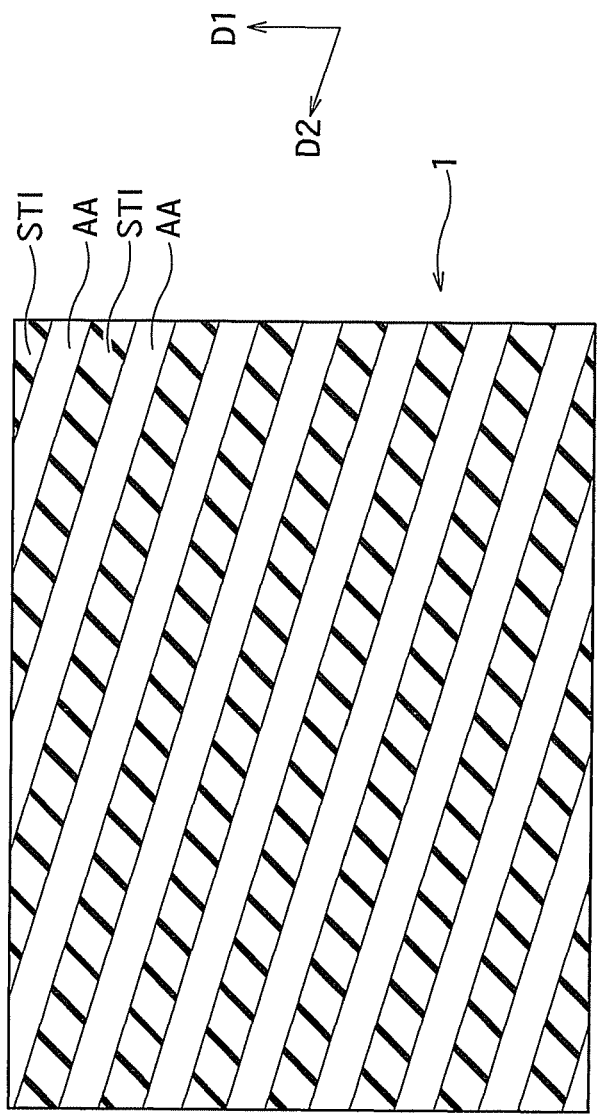
FIG. 34 is a plan view for illustrating the step of the method of manufacturing the semiconductor memory device 200 shown in FIG. 33.

First, as shown in FIG. 34, the active area "AA" isolated by the element isolation area "STI" is formed on the semiconductor substrate 1. The channel direction of the active area "AA" is the second direction D2.

Then, the grooves 2a and 2b extending in the first direction D1, which is oblique to the second direction D2, are formed in the upper surface of the semiconductor substrate 1, and the gate oxide films 3a and 3b shown in FIG. 33 are deposited on the inner surfaces of the grooves 2a and 2b by thermal oxidation.

Figure 35:
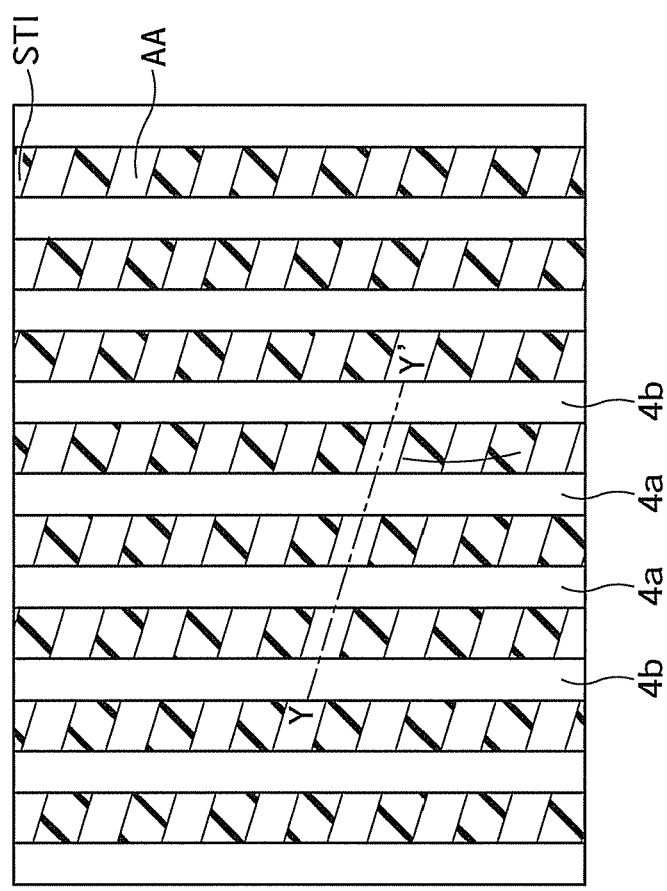
FIG. 35 is a plan view for illustrating the step of the method of manufacturing the semiconductor memory device 200 shown in FIG. 33, is continuous from FIG. 34.

Then, a metal, such as TiN and W, is buried in the grooves 2a and 2b and then, the part of the buried metal below the surface of the semiconductor substrate 1 is recessed by RIE. In this way, the gate electrodes 4a and 4b are buried in the grooves 2a and 2b with the gate insulating films 3a and 3b formed on the inner surfaces thereof (FIG. 35).

Then, the source region "S" and the drain region "D" are formed on the semiconductor substrate 1 except for the element isolation area "STI" and the buried gates by lithography and ion implantation, for example.

In this way, the source region "S" and the drain region "D" are formed on the upper surface of the active area "AA" of the semiconductor substrate 1 on the opposite sides of the gate electrode 4a (FIG. 33).

Then, Ti, Co, Ni or the like to form a silicide is deposited to establish an electrical contact between the semiconductor substrate 1 and the MTJ element "M". Then, the silicide film 6a is formed on the source region "S" and the drain region "D" by silicidation.

Then, Ta, TaN, TiN or the like to form the lower electrode 6c shown in FIG. 33 is deposited, and then the surfaces of the electrodes are flattened by CMP.

Then, a first ferromagnetic layer 7a, a barrier layer 7b, a second ferromagnetic layer 7c and a hard mask layer 105 are each deposited by sputtering, for example.

Then, the hard mask layer 105 is selectively etched by lithography or RIE, and then, the first ferromagnetic layer 7a, the barrier layer 7b and the second ferromagnetic layer 7c are etched by ion milling using the remaining hard mask layer 105 as a mask.

Figure 36:
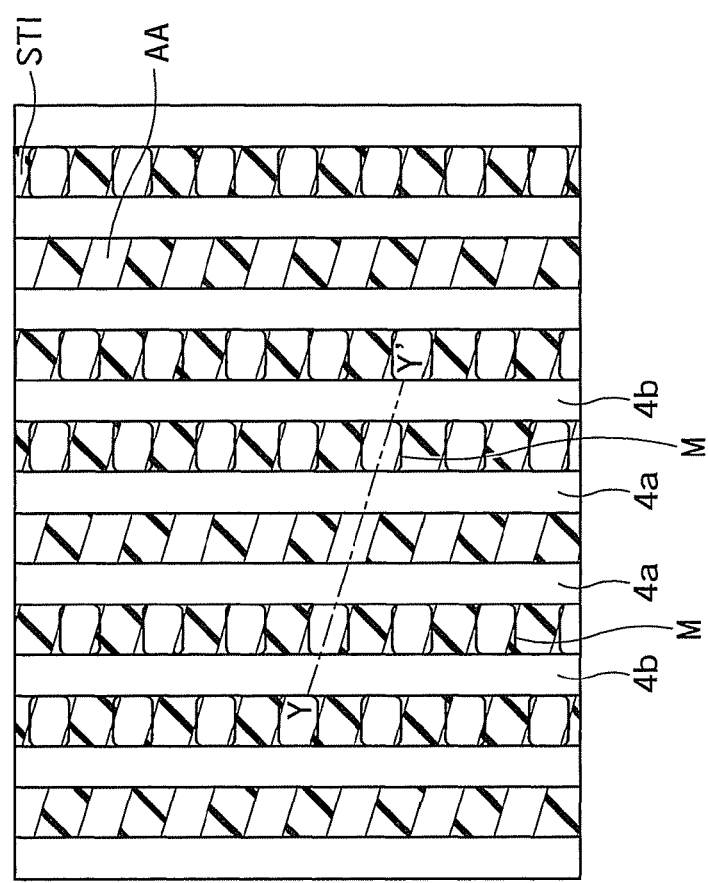
FIG. 36 is a plan view for illustrating the step of the method of manufacturing the semiconductor memory device 200 shown in FIG. 33, is continuous from FIG. 35.

In this way, the MTJ element "M" having a variable resistance that varies with the direction of magnetization that is electrically connected to the source region "S" at one end is formed over the source region "S" (FIG. 36).

Then, a protective film that serves as a protection against oxidation of SiN or the like or an adverse effect of water, a reducing gas, hydrogen or the like is formed by CVD or ALD, for example.

Then, an interlayer insulating film 106a shown in FIG. 33 is deposited on the semiconductor substrate 1 by CVD or application, for example, thereby burying the step formed by the MTJ element "M".

Then, the step on the interlayer insulating film 106a formed by the MTJ element "M" is flattened by CMP, for example.

Then, the upper surface of the conductive hard mask 105 shown in FIG. 33 is exposed by RIE or ion milling, for example.

Then, a TiN film to constitute the upper electrode 9 is deposited by sputtering, and then, the TiN film, the interlayer insulating film and the lower electrode 6c are etched at the same time by lithography and RIE.

Then, an etching stopper film is deposited by CVD. Then, a wire forming interlayer insulating film 106b is deposited by PCVD.

Then, a source line wiring groove is formed in the interlayer insulating film 106a at a position above the upper electrode 9 on the MTJ element "M". At the same time, a contact via is also formed.

Then, a TiN film and a W film are successively formed by CVD, wiring is buried, and the wiring excluding the part in a wiring part is removed by CMP to form the source line "SL" (FIG. 37).

Then, a bit line contact 110 is formed by lithography and RIE, for example, and tungsten is buried in the bit line contact 110 by sputtering, CVD or CMP. In this way, the bit line contact wire "CB" electrically connected to the drain region "D" is formed (FIG. 38).

Then, a bit line groove (not shown) is formed by lithography and RIE, for example. Then, a barrier metal and a Cu plating are deposited, and then, the surface is flattened by CMP. In this way, the bit line "BL" electrically connected to the drain region "D" is formed (FIG. 38). In this step, wiring of the peripheral circuit can also be formed. Multilayer wiring (not shown) is formed in the same multilayer wiring process as the process for forming the bit line "BL".

Through the steps described above, the semiconductor memory device 200 shown in FIG. 33 is completed.

The bit line "BL" is positioned in a layer higher than the MTJ element "M" and the source line "SL", as described above (FIGS. 39 and 40).

As described above, in the structure of the semiconductor memory device 200 according to the second embodiment, as in the first embodiment, the gate of the transistor "Tr" is buried in the semiconductor substrate 1, and the lower electrode 6c of the MTJ element "M" is formed on the silicide film 6a formed on the semiconductor substrate 1. Therefore, no seam occurs in the tungsten plug below the MTJ element "M".

In particular, since flattening by CMP is performed before the MTJ element "M" and the base film are formed as described above, the effect of irregularities on the surface of the silicide film 6a can be removed.

Furthermore, according to the method of manufacturing the semiconductor memory device 200, the process of forming the base film does not involve burying of a high gate step and CMP. Therefore, a step is less likely to occur because of over etching in CMP.

Thus, the MTJ element "M" can be substantially formed on a flat part, and the effect of irregularities on the MTJ characteristics can be removed.

Figure 41:
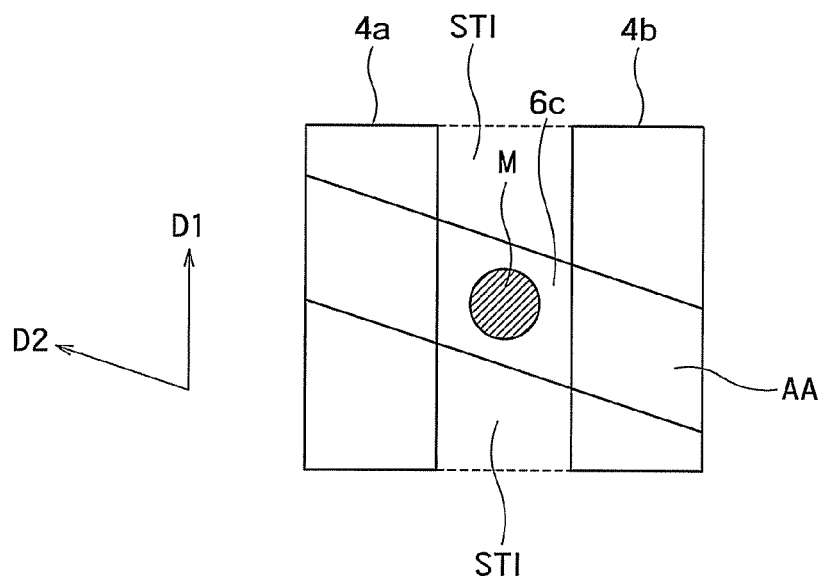
FIG. 41 is a plan view showing an example of a layout of the MTJ element "M" and its vicinity shown in FIG. 38.
Figure 42:
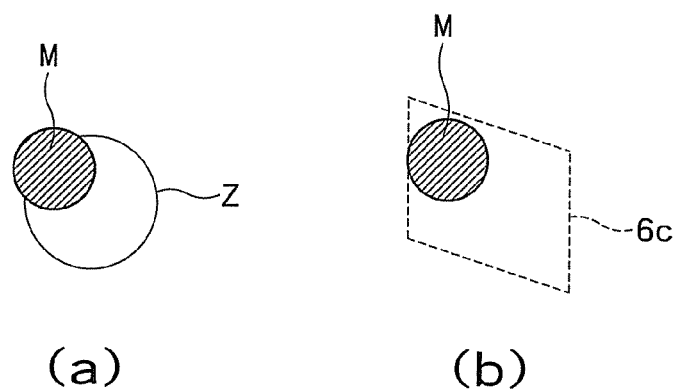
FIG. 42 are plan views showing layouts of the MTJ element according to the second embodiment and a comparative example.
Figure 43:
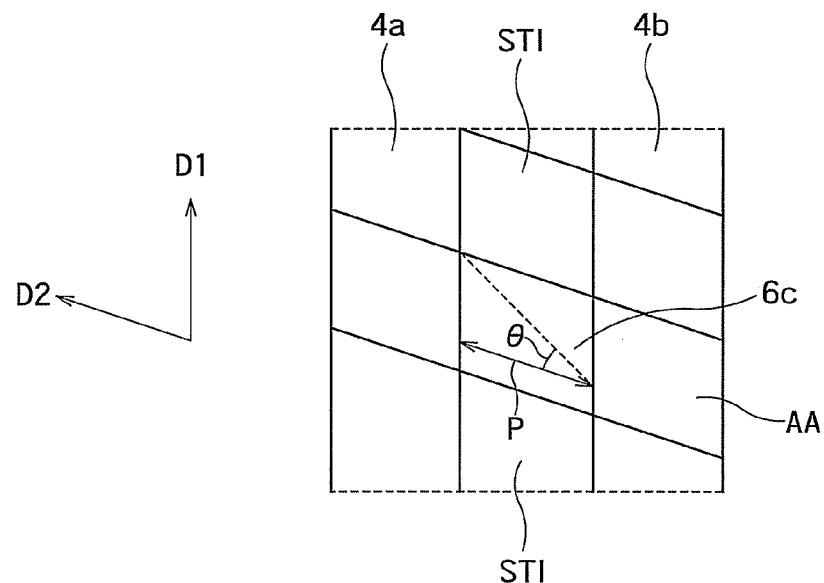
FIG. 43 is a plan view showing an example of a layout of the drain region "D" and its vicinity in which the MTJ element "M" is disposed shown in FIG. 38.
Figure 44:
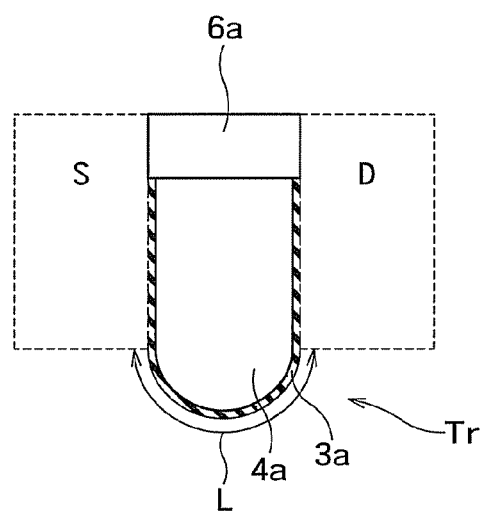
FIG. 44 is a cross-sectional view of the cell transistor in the semiconductor memory device 200.

FIG. 41 is a plan view showing an example of a layout of the MTJ element "M" and its vicinity shown in FIG. 38. FIG. 42 are plan views showing layouts of the MTJ element according to the second embodiment and a comparative example. FIG. 43 is a plan view showing an example of a layout of the drain region "D" and its vicinity in which the MTJ element "M" is disposed shown in FIG. 38. FIG. 44 is a cross-sectional view of the cell transistor in the semiconductor memory device 200. FIG. 42(a) shows the comparative example, and FIG. 42(b) shows the second embodiment.

With the layout shown in FIG. 42(a) in which the MTJ element "M" is disposed on a circular via, electrode or the like, the MTJ element "M" is likely to straddle a step.

On the other hand, with the layout of the semiconductor memory device 200 shown in FIG. 38, the MTJ element is more likely to be disposed on a flat part (the lower electrode 6c flattened by CMP (on the drain region "D")) of the semiconductor substrate 1 as shown in FIGS. 41 and 42(b).

As shown in FIG. 43, with the layout of the semiconductor memory device 200 shown in FIG. 38, the pitch in the direction of the bit line "BL" (the second direction D2) is multiplied by F/cos θ on the assumption that the pitch of the active area "AA" is 2 F.

As described above, the cell transistor "Tr" in the semiconductor memory device 200 has a buried gate. Therefore, as shown in FIG. 44, even if it is assumed that the word line pitch is 2 F in the direction of the word line (the first direction D1), the gate width "L" of the cell transistor "Tr" is expected to be longer due to the curvature, so that the short channel effect can be reduced.

Therefore, the word line (gate electrode) can be formed to be narrower than F by lithography and slimming.

Furthermore, the area decrease of the semiconductor memory device 200 because of the side walls (SiN) of the word line is smaller than that of the device according to the conventional technique described earlier. Accordingly, the active area "AA" between the word lines (gate electrodes) can be increased.

As a result, the effect of the steps formed by the buried gate and on the element isolation area "STI" can be avoided, and the adverse effect of the steps can be more effectively removed.

Figure 45:
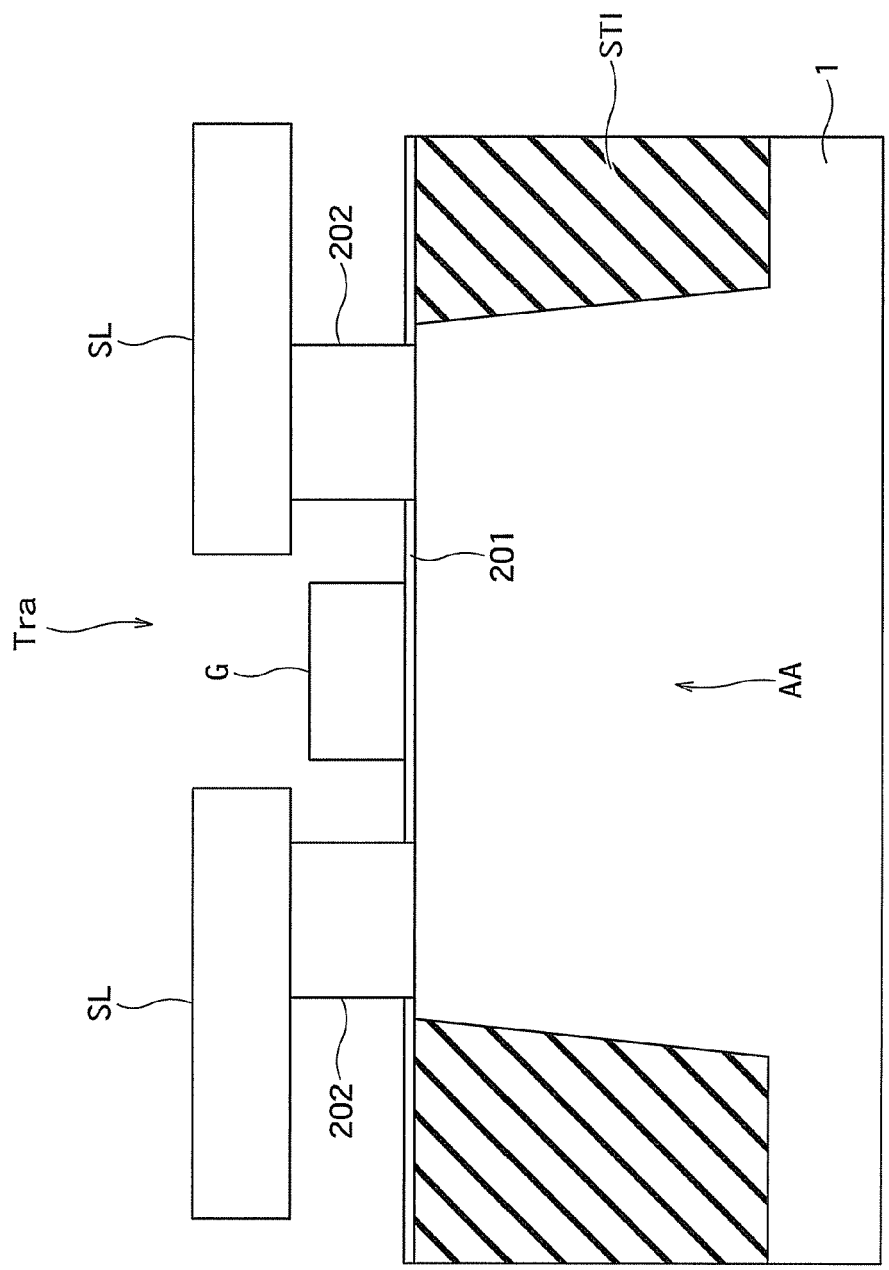
FIG. 45 is a cross-sectional view showing an example of a configuration of a peripheral transistor "Tra" in the peripheral circuit.

FIG. 45 is a cross-sectional view showing an example of a configuration of a peripheral transistor "Tra" in the peripheral circuit.

As shown in FIG. 45, in the process of manufacturing the peripheral transistor "Tra", a gate electrode "G" on a gate insulating film 201 is formed in the same layer as the bit line "BL", so that the time required to complete the process can be reduced. The source and drain regions of the peripheral transistor "Tra" are connected to the source line "SL" via a contact wire 202.

As described above, the semiconductor memory device according to the second embodiment and the method of manufacturing the same can improve the characteristics of the MTJ element.

Third Embodiment

In a third embodiment, an example of a configuration in which a source line and a bit line are formed in the same wiring layer will be described.

Figure 46:
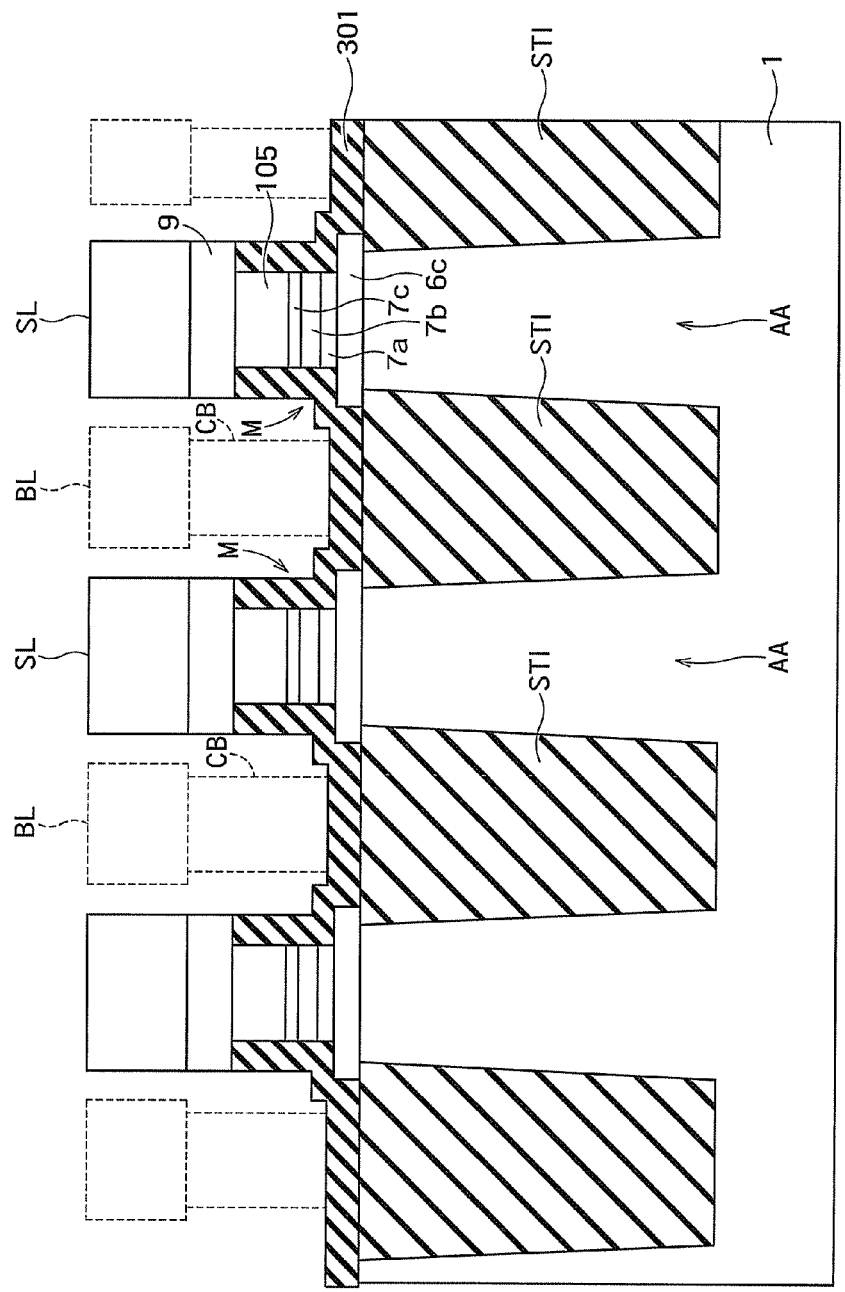
FIG. 46 is a cross-sectional view showing another example of the cross section taken along the line A-A' in FIG. 38.
Figure 47:
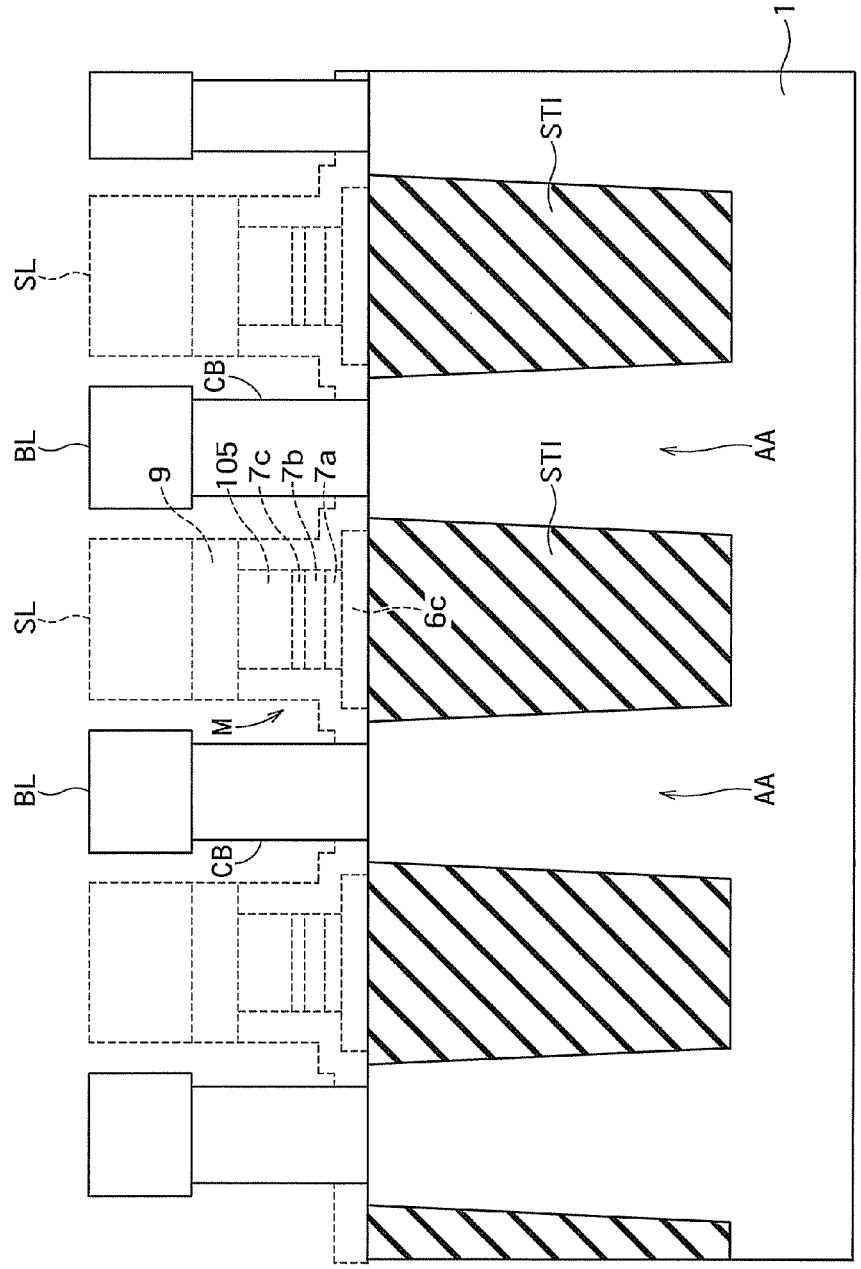
FIG. 47 is a cross-sectional view showing another example of the cross section taken along the line B-B' in FIG. 38.

FIG. 46 is a cross-sectional view showing another example of the cross section taken along the line A-A' in FIG. 38. FIG. 47 is a cross-sectional view showing another example of the cross section taken along the line B-B' in FIG. 38. In FIGS. 46 and 47, the same reference numerals as those in FIG. 33 denote the same components as those in the second embodiment.

As shown in FIGS. 46 and 47, the bit line "BL" is formed in the same wiring layer as the source line "SL". The remainder of the configuration is the same as that in the second embodiment.

Next, an example of a method of manufacturing the semiconductor memory device configured as described above will be described.

The method of manufacturing the semiconductor memory device is basically the same as the method according to the second embodiment. That is, the method of forming the transistor "Tr" and the MTJ element "M" according to this embodiment is the same as the method according to the second embodiment.

For example, after the upper electrode 9, the interlayer insulating film and the lower electrode 6c of the MTJ element "M" are formed, an etching stopper film (SiN) 301 is deposited by CVD. Then, a wire forming interlayer insulating film is deposited by PCVD, for example.

Then, a contact via is formed in the silicide film in the drain region and the upper electrode on the MTJ element "M" at the same time. In this process, a contact is formed in the etching stopper film 301 in the SAC structure under RIE conditions including a selection ratio. In this way, the cell area can be minimized.

Then, a TiN film and a W film are successively formed by CVD to fill the contact vias, and the resulting structure is flattened by CMP. In this way, the bit line contact wire "CB" is formed. Note that illustration of the contact wire for the source line is omitted in FIGS. 46 and 47.

Then, an insulating film is deposited on the contact vias by PCVD, a wiring pattern is formed by lithography and RIE, a barrier metal and a Cu are deposited by sputtering and plating, respectively, for example. Then, the surface of the resulting structure is flattened by CMP to form the bit line "BL" and the source line "SL" (FIGS. 46 and 47).

Multilayer wiring (not shown) is formed in the same multilayer wiring process as the process for forming the bit line "BL" and the source line "SL".

The structure according to this embodiment has an advantage that one layer of wiring can be omitted while maintaining the advantage of the second embodiment that the MTJ element can be formed on a flat part.

As described above, the semiconductor memory device according to the third embodiment and the method of manufacturing the same can improve the characteristics of the MTJ element, as with those according to the second embodiment.

Fourth Embodiment

In a fourth embodiment, an example of a configuration in which a bit line is formed in a layer lower than a source line will be described.

Figure 48:
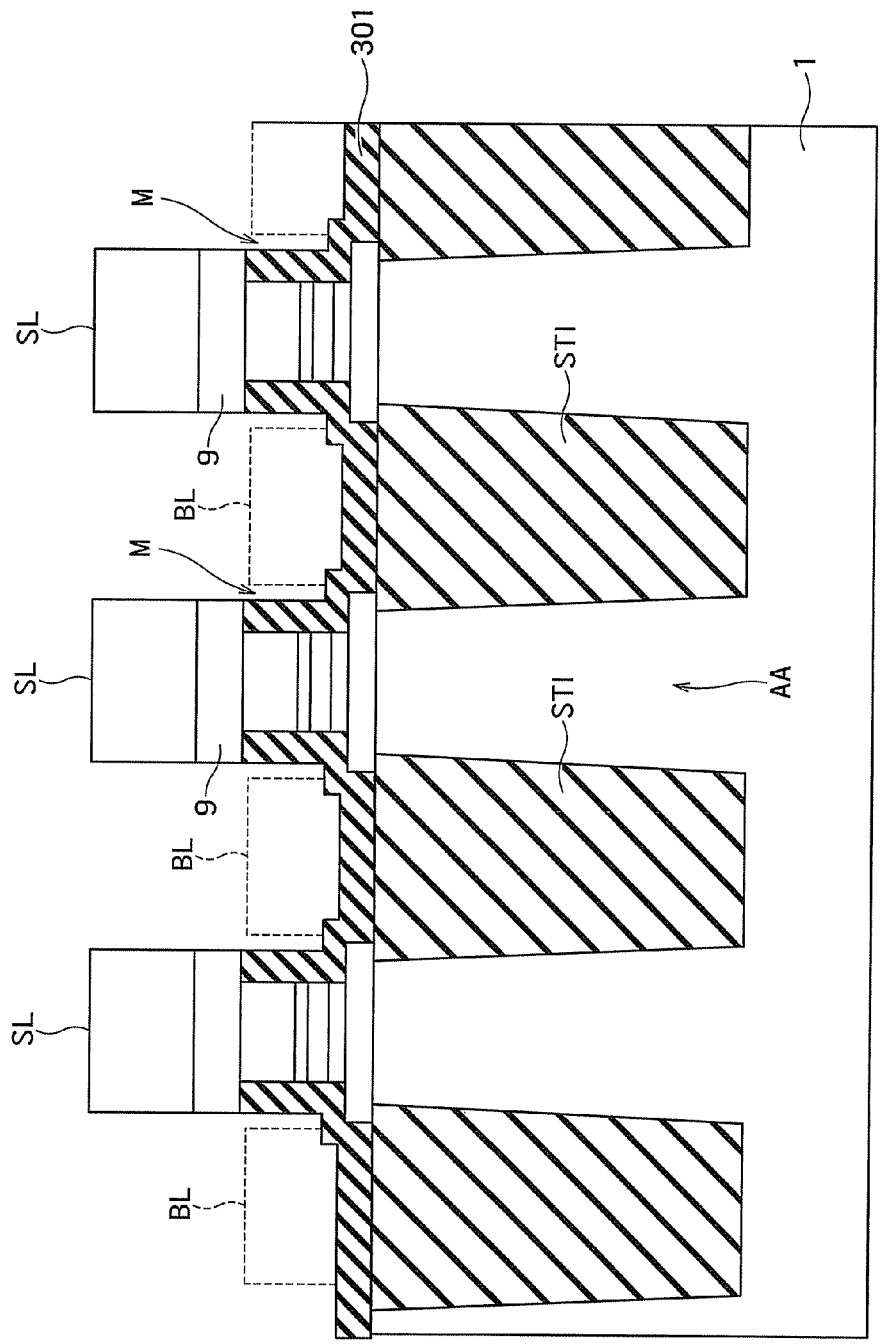
FIG. 48 is a cross-sectional view showing another example of the cross section taken along the line A-A' in FIG. 38.
Figure 49:
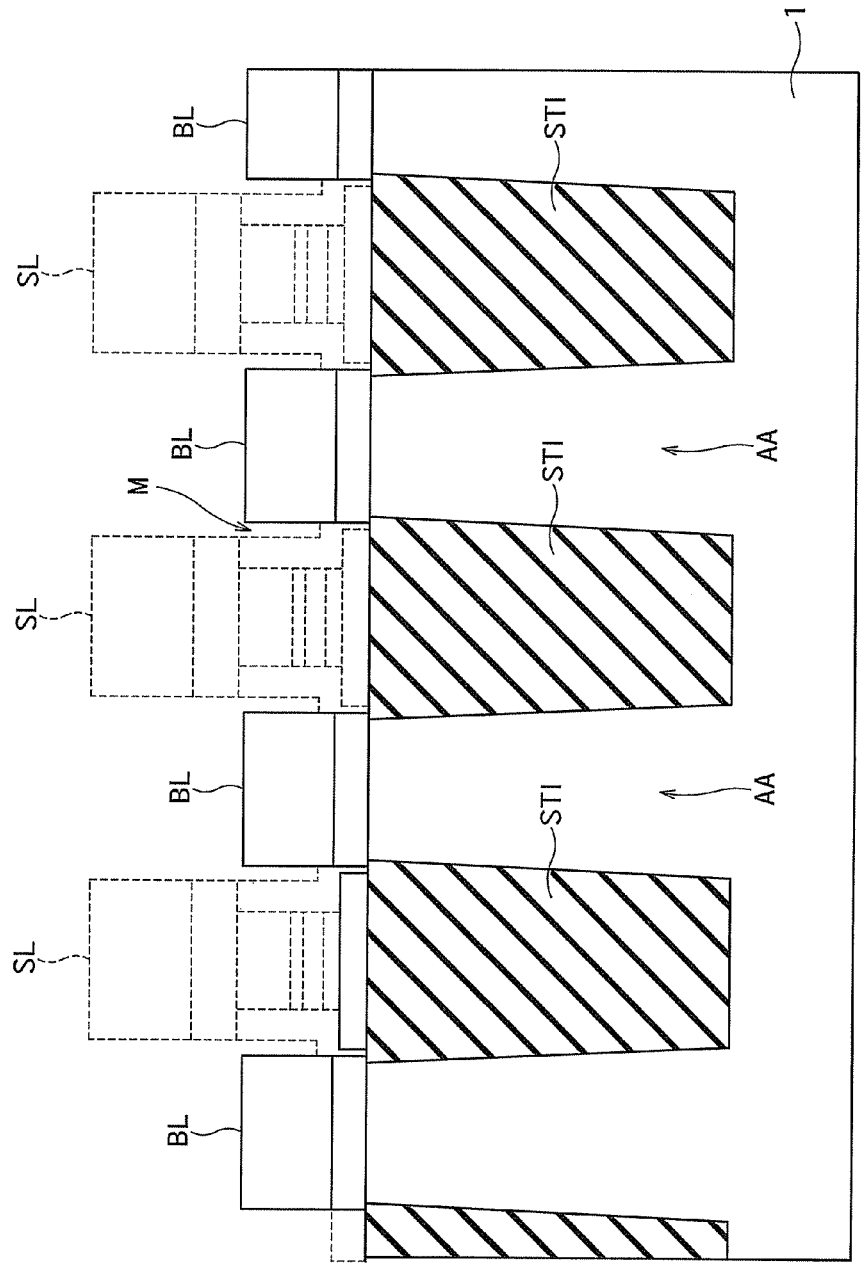
FIG. 49 is a cross-sectional view showing another example of the cross section taken along the line B-B' in FIG. 38.

FIG. 48 is a cross-sectional view showing another example of the cross section taken along the line A-A' in FIG. 38. FIG. 49 is a cross-sectional view showing another example of the cross section taken along the line B-B' in FIG. 38. In FIGS. 48 and 49, the same reference numerals as those in FIG. 33 denote the same components as those in the second embodiment.

As shown in FIGS. 46 and 47, the bit line "BL" is formed in a layer lower than the source line "SL". The remainder of the configuration is the same as that in the second embodiment.

Next, an example of a method of manufacturing the semiconductor memory device configured as described above will be described. The method of manufacturing the semiconductor memory device is basically the same as the method according to the second embodiment. That is, the method of forming the transistor "Tr" and the MTJ element "M" according to this embodiment is the same as the method according to the second embodiment.

For example, after the upper electrode 9, the interlayer insulating film and the lower electrode 6c of the MTJ element "M" are formed, an etching stopper film (SiN) 301 is deposited by CVD. Then, a wire forming interlayer insulating film is deposited by PCVD, for example.

Then, a groove for the bit line "BL" is formed at a side of the MTJ element "M" by lithography and RIE, and a barrier metal film and tungsten to form the bit line are buried by CVD. Then, the height of the tungsten wire is adjusted by etch back according to RIE. In this way, the bit line "BL" is formed.

The upper end of the bit line "BL" is preferably positioned lower than the upper electrode 9 in order to prevent a short circuit when a contact to the upper electrode 9 on the MTJ element "M" is formed.

Furthermore, the gap is filled with an interlayer insulating film by PCVD, and the surface of the interlayer insulating film is flattened by CMP. Then, a groove for the source line "SL" is formed in the interlayer insulating film at a position above the upper electrode 9 on the MTJ element "M" by lithography and RIE.

Then, an interlayer insulating film (not shown) is formed by PCVD, and multilayer wiring (not shown) is formed.

Figure 50:
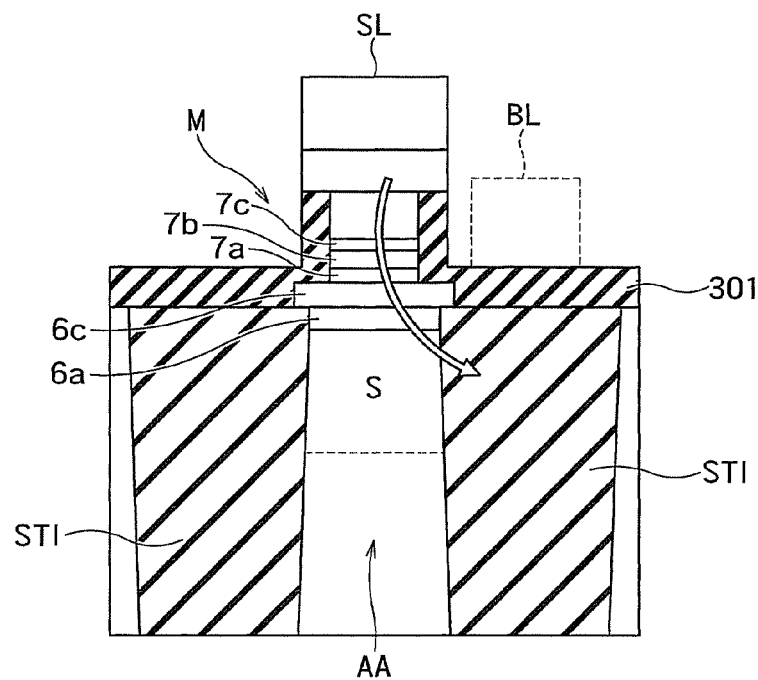
FIG. 50 is a cross-sectional view for illustrating a magnetic field induced by a current flowing through the bit line "BL" in an area of the MTJ element "M" and its vicinity shown in FIG. 48.
Figure 51:
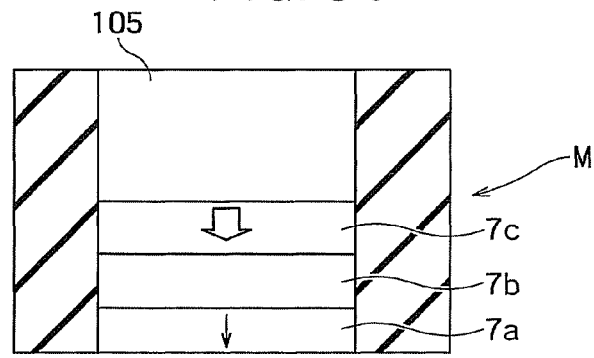
FIG. 51 is a cross-sectional view showing a case where the directions of magnetization of the first ferromagnetic layer $7a$ and the second ferromagnetic layer $7c$ of the MTJ element are aligned with each other.
Figure 52:
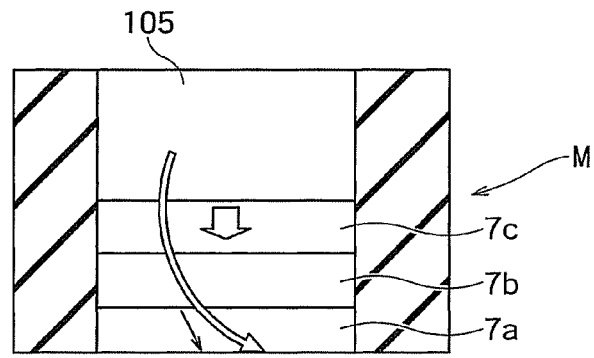
FIG. 52 is a cross-sectional view showing a case where the direction of magnetization of the first ferromagnetic layer $7a$ of the MTJ element varies with the induced magnetic field.

FIG. 50 is a cross-sectional view for illustrating a magnetic field induced by a current flowing through the bit line "BL" in an area of the MTJ element "M" and its vicinity shown in FIG. 48. FIG. 51 is a cross-sectional view showing a case where the directions of magnetization of the first ferromagnetic layer 7a and the second ferromagnetic layer 7c of the MTJ element are aligned with each other. FIG. 52 is a cross-sectional view showing a case where the direction of magnetization of the first ferromagnetic layer 7a of the MTJ element varies with the induced magnetic field.

According to this embodiment, as particularly shown in FIGS. 48 and 49, the bit line "BL" is disposed at a side of the MTJ element "M". Therefore, as shown in FIGS. 50 to 52, the spin of the MTJ element "M" can be inclined by the magnetic field induced by the current flowing through the bit line "BL" in a writing operation.

Therefore, this embodiment can have an advantage that a precession required for spin inversion of the MTJ element "M" can be more easily caused.

The remainder of the configuration of the semiconductor memory device is the same as that according to the second embodiment.

That is, the semiconductor memory device according to the fourth embodiment can improve the characteristics of the MTJ element, as with those according to the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a semiconductor substrate having an active area isolated by an element isolation area;
    a cell transistor having a gate insulating film deposited on an inner surface of a groove formed in an upper surface of the semiconductor substrate, a gate electrode buried in the groove with the gate insulating film formed on the inner surface thereof, and a source region and a drain region formed on an upper surface of the active area of the semiconductor substrate on opposite sides of the gate electrode;
    an MTJ element having a variable resistance that varies with a direction of magnetization that is provided on the source region and electrically connected to the source region at a first end thereof;
    a source line electrically connected to a second end of the MTJ element; and
    a bit line electrically connected to the drain region.

2. The semiconductor memory device according to claim 1, further comprising:
- a silicide film formed in the source region and the drain region; and
- a barrier metal film formed on the silicide film.

3. The semiconductor memory device according to claim 2, wherein the first end of the MTJ element is electrically connected to the source region via the silicide film and the barrier metal film.

4. The semiconductor memory device according to claim 1, wherein the MTJ element has:
- a first ferromagnetic layer that is formed over the source region and is electrically connected to the source region;
- a barrier layer that is formed on the first ferromagnetic layer; and
- a second ferromagnetic layer that is formed on the barrier layer and is electrically connected to the source line.

5. The semiconductor memory device according to claim 1, further comprising a bit line contact plug formed over the drain, the bit line contact plug electrically connects the drain region and the bit line.

6. The semiconductor memory device according to claim 1, wherein the bit line is positioned in a layer higher than the MTJ element and the source line.

7. The semiconductor memory device according to claim 1, wherein the bit line is positioned in a layer lower than the source line.

8. The semiconductor memory device according to claim 1, wherein the bit line is formed in a same wiring layer as the source line.

9. The semiconductor memory device according to claim 1, wherein a width of the gate electrode is smaller than a distance between adjacent gate electrodes.

10. The semiconductor memory device according to claim 2, wherein an upper surface of the barrier metal film is substantially flat.

11. The semiconductor memory device according to claim 2, wherein the bit line is electrically connected to the drain region via the silicide film and the barrier metal film.

12. The semiconductor memory device according to claim 1, wherein the bit line is formed in a same wiring layer as a gate electrode of a peripheral transistor.

* * * * *